United States Patent [19]
Muraoka et al.

[11] Patent Number: 5,352,910
[45] Date of Patent: Oct. 4, 1994

[54] SEMICONDUCTOR DEVICE WITH A BUFFER STRUCTURE

[75] Inventors: Kimihiro Muraoka, Kanagawa; Takashige Tamamushi, Tokyo, both of Japan

[73] Assignee: Tokyo Denki Seizo Kabushiki Kaisha, Tokyo, Japan

[21] Appl. No.: 42,152

[22] Filed: Apr. 2, 1993

[30] Foreign Application Priority Data

Apr. 7, 1992 [JP] Japan .................................. 4-114140
May 11, 1992 [JP] Japan .................................. 4-144887

[51] Int. Cl.$^5$ ............................................. H01L 29/74
[52] U.S. Cl. ................................. 257/148; 257/149; 257/155; 257/156; 257/169
[58] Field of Search ................ 257/148, 168, 156, 155, 257/169, 914, 149

[56] References Cited

U.S. PATENT DOCUMENTS

| | | | |
|---|---|---|---|
| 4,275,408 | 6/1981 | Yukimoto | 257/155 X |
| 4,574,296 | 3/1986 | Sueoka et al. | 257/155 X |
| 4,617,583 | 10/1986 | Shinohe et al. | 257/149 X |
| 4,654,679 | 3/1987 | Muraoka | 257/149 X |
| 4,662,957 | 5/1987 | Hagino | 257/156 X |
| 5,151,766 | 9/1992 | Hüppi | 257/156 X |

FOREIGN PATENT DOCUMENTS 0193169 8/1984 Japan .
5993169 4/1989 Japan .

OTHER PUBLICATIONS

Nishizawa et al, "Low-Loss High Speed Switching Device, 2500V-300A Static Induction Thyristor," PESC '85 Record, Proc. of the 16th Annual IEEE Power Electronics Specialists Conference, Toulouse, France, 1985, pp. 257-266.

*Primary Examiner*—William Mintel
*Attorney, Agent, or Firm*—McGlew & Tuttle

[57] ABSTRACT

The present invention is directed to power semiconductor devices and, more particularly, to a semiconductor device with a static induction buffer structure which reduces the resistance of a buffer layer, enhances the injection efficiency of holes from the anode and permits the application of a high-intensity electric field across the cathode and anode, and a semiconductor device with a drift buffer structure in which an impurity density (concentration) gradient is set in a buffer layer to generate an internal electric field for holes to enhance the injection efficiency of holes from the anode and increase the electron storage efficiency or and impurity density (concentration) gradient is set in an anode region to generate an internal electric field for electrons and a high-intensity electric field can be applied across the cathode and anode.

30 Claims, 14 Drawing Sheets

1p < 2Ln

⊠ --- n⁺ BUFFER SHORTED REGION 4

SEMICONDUCTOR DEVICE WITH A BUFFER STRUCTURE

BACKGROUND OF THE INVENTION

1. Field of the Invention

The present invention relates to a power semiconductor devices and, more particularly, to a semiconductor device with a new buffer structure (hereinafter referred to as static induction buffer structure) which permits reduction of the resistance of the buffer layer, increases the injection ratio of holes from the anode and allows the application a high-intensity electric field across the cathode and anode. The invention also pertains to a semiconductor device with a new buffer structure (hereinafter referred to as a drift buffer structure) wherein an impurity density (concentration) gradient is provided in the buffer layer to generate an internal electric field for holes to increase the injection ratio of holes from the anode and enhance the electron storage efficiency, or wherein an impurity density (concentration) gradient is provided in the anode region to generate an internal electric field for electrons and a high-intensity electric field can be applied across the cathode and the anode. The drift buffer structure mentioned above is one that permits the generation of an internal electric field for holes on the basis of an impurity density gradient, but in this specification the term "drift buffer structure" includes also structures of the type that an impurity density (concentration) gradient is provided not only in the buffer layer but also in the anode region adjacent thereto to generate an internal electric field for electrons. The drift buffer structure is further effective when used in combination with a static induction buffer structure.

2. Description of the Prior Art

Heretofore there have been a variety of semiconductor devices of the type having a buffer layer, such as a gate turn-off thyristor of high breakdown voltage, a static induction thyristor, an insulated gate bipolar transistor and an insulated gate static induction thyristor. These semiconductor devices are common in the adoption of the structure wherein an n-type buffer layer is positively interposed between the anode (collector) region and a high-resistivity region of an n-type base layer so that the distribution of the electric field between the gate (base) and the anode (collector) is virtually triangular or trapezoidal to permit uniform application of a high-intensity electric filed to the vicinity of the anode region. This structure allows reduction of the thickness of the high resistivity layer and ease in increasing the breakdown voltage and highly improves the turn-ON characteristic of the device because of the drift motion of carriers in the high resistivity layer under the action of the high-intensity electric field.

The static induction thyristor with an n-type buffer structure has such a construction as disclosed in Japanese Patent Publication No. 31869/84. Moreover, trial manufacture of a 2500V-300A class buried gate static induction thyristor is also reported in "LOW-LOSS HIGH SPEED SWITCHING DEVICE, 2500V-300A STATIC INDUCTION THYRISTOR," PROC. OF THE 16TH ANNUAL IEEE POWER ELECTRONICS SPECIALISTS CONFERENCE (PESC '85).

FIG. 27 is a sectional view schematically showing the internal construction of the above-mentioned buried gate static induction thyristor. In FIG. 27, reference numeral 1 indicates an anode electrode, 2 an anode region, 3 an n-type buffer layer, 4 an n-type buffer short-circuit layer, 5 a high resistivity layer, 6 a gate region, 7 an epitaxial layer, 8 a cathode region, 9 a cathode electrode and 10 a gate electrode. The n-type buffer layer 3 is electrically connected by the $n^+$-type region 4 to the p-type anode region 2. The $n^+$-type region 4 is formed in the p-type anode region 2 substantially below the gate electrode 10.

The quantity of holes which are injected from the anode side depends on the thickness of the n-type buffer layer 3 and the impurity density (concentration) therein. With too high the impurity density of the n-type buffer layer 3, the quantity of holes injected is small, affecting the turn-ON characteristic and the ON-state voltage. When the impurity density (concentration) of the n-type buffer layer 3 is low, the quantity of holes injected increases but a high-intensity electric field may sometimes enter into the n-type buffer layer 3 and cause a punch through, and hence the breakdown voltage cannot be set so high. This problem could be solved by forming the n-type buffer layer 3 to a relatively large thickness, but such a relatively thick n-type buffer layer with a predetermined impurity density (concentration) is likely to present problems such as an increase in the ON-state voltage, a decrease in the quantity of holes injected and a slow transition to latching up (i.e. a decrease in the turn-ON response speed). It is a general practice in the prior art, therefore, to form the n-type buffer layer relatively thick although it may preferably be thin, besides its impurity density is usually medimum so as to permit the injection of holes in certain quantities although a high impurity density is desirable from the viewpoint of preventing an increase in the breakdown voltage.

Moreover, the n-type buffer layer 3 is interposed, as a region having a predetermined impurity density, between the anode region 2 and the high resistivity layer 5, and if the n-type buffer layer 3 remains electrically floating with respect to the anode region 2, electrons stored in the n-type buffer layer 3 remain therein for a period of time dependent on their lifetime. In this instance, the injection of holes from the anode region 2 occurs and when the lifetime of electrons is long, holes are injected excessively. Hence it is desirable that the n-type buffer layer 3 be electrically shorted to the anode region 2. With an increased short-circuit ratio, the effect of the n-type buffer layer lessens, with the result that no latching up occurs or the quantity of holes to be injected decreases, and in this instance, the turn-ON characteristic of the device is deteriorated even if its turn-OFF and tail characteristics are improved. Since the n-type buffer layer 3 is lamellar, it is also necessary to decrease its resistance in the lateral direction. Moreover, the conventional buffer structure having the base structure has a defect that the ON-state voltage is likely to be high.

There has been well-known a drift transistor which utilizes a structure capable of generating a drift field in the base layer of a bipolar transistor. For semiconductor devices of the type including a thyristor structure with a buffer layer, in particular, however, there has not been proposed a structure which has an impurity density (concentration) gradient set in the buffer layer so that a drift field is generated therein for holes when they are injected from the anode region and/or structure which has a similar impurity density (concentration) gradient set in the anode region to generate a drift field for electrons (which structures will hereinafter be referred to generically as a drift buffer structure).

The drift buffer structure mentioned above is a structure that has an impurity density gradient for generating drift fields for holes and electrons in either one or both of the buffer layer and the anode region adjacent thereto. The reason for which both of the buffer layer and the anode region need to be taken into account is that electrons and holes both contribute to turning ON and OFF the semiconductor devices of the type employing the thyristor structure. It is possible, of course, to use a structure that has the impurity density gradient in only one of the two regions with a view to producing the effect by either electrons or holes alone. It is preferable, however, to implement a structure that permits the generation of drift fields for both of the electrons and holes.

SUMMARY OF THE INVENTION

It is therefore an object of the present invention to provide a semiconductor device of a static induction buffer structure which has a high injection efficiency of holes from the anode region and a low resistivity of the buffer layer, permits the application of a high-intensity electric field across the cathode and anode and has a high breakdown voltage.

Another object of the present invention is to provide a semiconductor device which has an improved ON-state voltage through utilization of the static induction buffer structure.

Another object of the present invention is to provide a semiconductor device of a drift buffer structure which has a high injection efficiency of holes from the anode region and/or high efficiency of discharging stored electrons in the buffer layer to the anode electrode, permits the application of a high-intensity electric field across the cathode and anode and has a high breakdown voltage.

Another object of the present invention is to provide a semiconductor device of a drift buffer structure which permits electrons stored in the buffer layer to easily migrate in the anode region by dint of a drift field and hence has a high efficiency of discharging electrons to the anode electrode, providing for improved turn-OFF characteristic of the device.

Another object of the present invention is to provide a semiconductor device which has a low resistivity in the buffer layer and an ON-state voltage improved as compared with that obtainable with the conventional base layer structure, through utilization of a drift buffer structure combined with a static induction buffer structure.

Still another object of the present invention is to provide a semiconductor device which has an improved turn-OFF characteristic through utilization of a drift buffer structure combined with a shorted anode structure or static induction shorted anode structure.

The static induction (SI) buffer structure proposed by the present invention is a buffer structure that utilizes the static induction effect. That is, in the ON state holes flow mainly in a low impurity density region of the SI buffer layer and electrons injected thereinto from the cathode are stored in a high impurity density region of the buffer layer. The high impurity density region is shorted to the anode region at a pitch twice the diffusion length $L_n$, $2L_n$, of electron or less and has an effect of absorbing electrons by the anode electrode, corresponding to their lifetime $\tau_n$ in the SI buffer layer. The high impurity density region in the SI buffer layer may also be replaced with a tungsten (W), molybdenum (Mo), cobalt (Co), platinum (Pt) or similar metal layer, or metal silicide layer.

The point is that the low impurity density region of the SI buffer layer needs only to be depleted by a diffusion potential which is produced between it and the high impurity density region or the above-mentioned metal layer. The thickness and impurity density of the low impurity density region are chosen such that the potential therein is controlled by the potential of the high impurity density region or metal layer of the SI buffer layer in a capacitive coupled fashion. A channel region is formed as a path through which holes flow in the ON state of the device, but this channel region is a depleted one and its barrier height is variable in a capacitive coupled fashion by potential barrier control utilizing the static induction effect. The channel length may preferably be small since it increases the number of holes that are injected, while at the same time it is necessary that the channel region have a potential barrier high enough to block a high voltage when a depletion layer spreading from the cathode side reaches the channel region. It is mainly the high impurity density region or metal layer of the SI buffer layer that blocks a high-intensity electric field, but the depletion layer may sometimes enter into the low impurity density region as well, lowering the potential barrier of the channel in the low impurity density region. In this case, excessive lowering of the potential barrier of the channel will cause the injection of holes from the anode, lessening the effect of the buffer layer. In the SI buffer structure it is necessary, therefore, that the potential barrier of the channel in the low impurity density region be high enough to block a high-intensity electric field across the cathode and anode and be variable by the potential of the high impurity density (concentration) region or metal layer in a capacitive coupled manner.

The drift buffer structure mentioned herein is a buffer structure that permits the generation of an internal electric field for holes in the buffer layer on the basis of an impurity density gradient, but a structure that has an impurity density (concentration) gradient in the anode region adjacent the base layer to provide a drift field for electrons will also hereinafter be referred to as the drift buffer structure. The drift buffer structure is more effective when employed in combination with the SI buffer structure, shorted anode structure, or SI shorted anode structure.

One aspect of the present invention is directed to a semiconductor device with a static induction buffer structure which has anode, cathode and gate regions and a buffer layer formed in contact with or adjacent the anode region and in which the buffer layer has high and low impurity density regions, the low impurity density regions are each essentially depleted by a diffusion potential between it and the corresponding high impurity density (concentration) region and the high impurity density regions of the buffer layer are shorted to the anode region at a pitch smaller than 2Ln (where Ln is the diffusion length of electrons).

According to another aspect of the present invention, the buffer layer is reverse in conductivity type to the anode region.

According to another aspect of the presnet invention, the high impurity density regions of the buffer layer are reverse in conductivity to the anode region and the low impurity density regions are identical in conductivity type with the anode region or intrinsic semiconductor regions.

Another aspect of the present invention is directed to a semiconductor device with a static induction buffer structure which has anode, cathode and gate regions and a buffer layer formed in contact with or adjacent the anode region and in which the buffer layer has metal layers and low impurity regions, the low impurity density regions are each essentially depleted by a diffusion potential between it and the corresponding metal layer and the metal layers are shorted to the anode region at a pitch smaller than 2Ln (where Ln is the diffusion length of electrons).

According to another aspect of the present invention, the buffer layer and the anode region are separated by a thin semiconductor layer opposite in conductivity type to the anode region.

Another aspect of the present invention is directed to a semiconductor device with a drift buffer structure which has anode, cathode and gate regions and a buffer layer formed in contact with or adjacent the anode region and in which the buffer layer has an impurity density gradient that the impurity density gradually increases as the anode region is approached.

Another aspect of the present invention is directed to a semiconductor device with a drift buffer structure which has anode, cathode and gate regions and a buffer layer formed in contact with or adjacent the anode region and in which the impurity density (concentration) in the anode region between an anode electrode formed in contact with the anode region and the buffer layer has a gradient that gradually decreases as the anode electrode is approached.

Another aspect of the present invention is directed to a semiconductor device with a drift buffer structure which has anode, cathode and gate regions and a buffer layer formed in contact with or adjacent the anode region and in which the buffer layer has high and low impurity density (concentration) regions and the low impurity density regions are each essentially depleted by a diffusion potential between it and the corresponding high impurity density region.

According to another aspect of the present invention, the high impurity density regions of the buffer layer are shorted to the anode region at a pitch smaller than 2Ln (where Ln is the diffusion length of electrons).

According to another aspect of the present invention, the buffer layer is reverse in conductivity type to the anode region.

According to another aspect of the present invention, the high impurity density regions of the buffer layer are reverse in conductivity type to the anode region but the low impurity density regions are identical in conductivity type with the anode region or intrinsic semiconductor regions.

Another aspect of the present invention is directed to a semiconductor device with a drift buffer structure which has anode, cathode and gate regions and a buffer layer formed in contact with or adjacent the anode region and in which the buffer layer has metal layers and low impurity density regions, and the low impurity density regions are each essentially depleted by a diffusion potential between it and the corresponding metal layer.

According to another aspect of the present invention, the metal layers of the buffer layer are shorted to the anode region at a pitch smaller than 2Ln (where Ln is the diffusion length of electron).

According to another aspect of the present invention, the buffer layer and the anode region are separated by a thin semiconductor layer reverse in conductivity type to the anode region.

According to still another aspect of the present invention, the anode region has high and low impurity density (concentration) regions in the vicinity of the buffer layer and the low impurity density regions are each essentially depleted by a diffusion potential between it and the corresponding high impurity density region.

Other object, features and advantages of the present invention will become more apparent from the following description taken in conjunction with the accompanying drawings.

DESCRIPTION OF THE PREFERRED EMBODIMENTS

Figure 1:
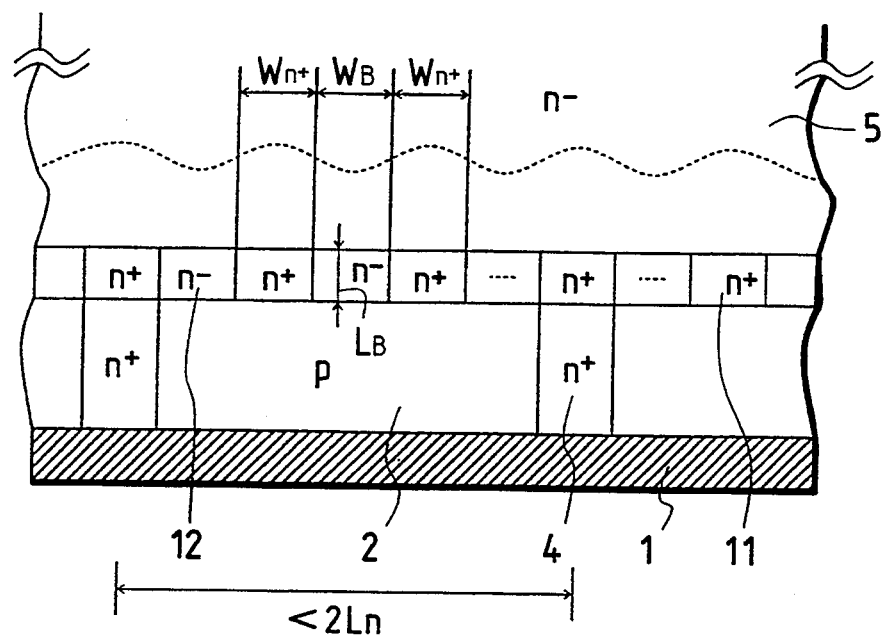
FIG. 1 is a schematic sectional view of a static induction (SI) buffer structure, for explaining the principle of its operation.
Figure 2:
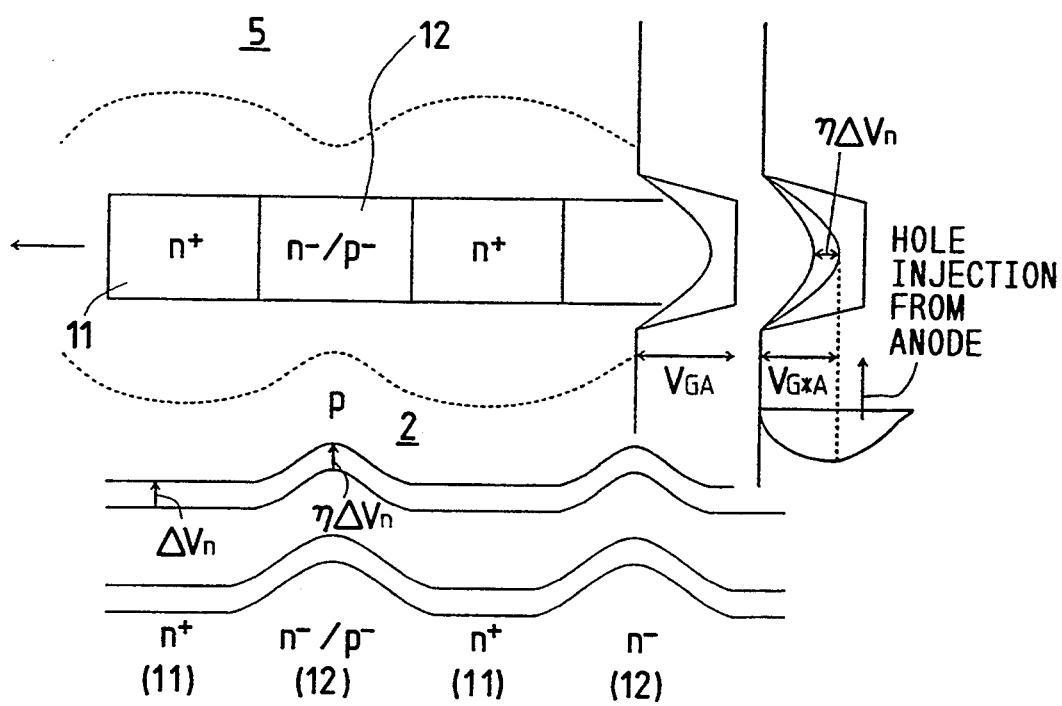
FIG. 2 is a potential distribution diagram for explaining the principle of operation of the SI buffer structure.

FIGS. 1 and 2 are schematic diagrams for explaining the principle of operation of the static induction (SI) buffer structure, FIG. 1 schematically illustrating, in section, the SI buffer structure applicable to the present invention and FIG. 2 showing the potential distribution in the SI buffer structure. In FIGS. 1 and 2 an n-type buffer structure is composed of high and low impurity density buffer layers 11 and 12. The n+-type layers, i.e. the high impurity density layers 11, are provided in a meshed, striped or similar pattern with the n⁻-type layers, i.e. the low impurity density layers 12 interspersed therein. The n+-type layers 11 and the n⁻-type layers 12 form the static induction (SI) buffer layer. Reference numeral 1 denotes an anode region and 5 a high resistivity layer (a substrate). Reference numeral 4 indicates n-type buffer short-circuit layers, by which the anode region 2 and the high impurity density buffer layers 11 are shorted at a pitch smaller than 2Ln (where Ln is the diffusion length of electrons). In FIGS. 1 and 2 the broken lines schematically show a depletion layer which spreads into the n⁻-type layers 5 and 12 on the basis of the n+ (11) n⁻ (12) junction. Letting the widths of the n+-type layer 11 and the n⁻-type layer 12 be represented by $W_{n+}$ and $W_B$, respectively, and the thickness of the layer 11 or 12 by $L_B$, the shape of the potential barrier in the n⁻-type layer 12 is determined by the sizes $W_B$ and $L_B$ and the impurity densities in the layers 11 and 12 and the anode region 2. In the SI buffer structure the n⁻-type layers 12 are essentially depleted by setting the above-mentioned parameters. The low impurity density regions 12 are shown to have the same conductivity type as the high impurity density regions 11 in FIG. 1, but as long as they are essentially depleted, they may also be of the other conductivity type, p⁻, or intrinsic (i).

The thickness $L_B$ corresponds to the channel length and the width $W_B$ the channel width. Holes that are injected from the anode region 2 flow mainly through the low impurity density region 12 of the width $W_B$ and the thickness $L_B$. On the other hand, electrons that are injected from the cathode are stored in the high impurity density regions 11, which are shorted to the anode region 2 via the buffer short-circuit regions 4 disposed at a pitch smaller than 2Ln (where Ln is the diffusion length of electron) as mentioned above.

In FIG. 2, letting a potential change by the electrons stored in the n+-type layer 11 and the resulting change in the height of a potential barrier in the n⁻-type layer 12 be represented by $\Delta V_n$ and $\eta \Delta V_n$, respectively, the number of holes, $\Delta p$, that are injected from the anode region, with respect to the number of electrons, $\Delta n$ that are injected into the anode region 2 from the n+-type layer 11, is such as given by the following expression:

$$\frac{\Delta p}{\Delta n} \sim \frac{p_A\, v_P}{n_B\, v_n} \exp \frac{q\,\eta}{kT} \Delta V_n \qquad (1)$$

where $P_A$ is the impurity density of the anode region 2, $n_B$ the impurity density of the n +-type layer 11, $v_P$ the hole injection rate (diffusion or drift), $v_n$ the electron injection rate (diffusion or drift), k the Boltzmann's constant, T the absolute temperature and $\eta$ a value close to a 1.

Letting the diffusion potential between the n+-type layer 11 and the p-type anode region 2 and the potential barrier height in the n⁻-type layer 11 against the holes in the anode region 2 be represented by $V_{GA}$ and $V_{G*A}$, respectively, the above-mentioned potential variation $\Delta V_n$ can also be given as follows:

$$\Delta V_n = V_{GA} - V_{G*A} \qquad \ldots (2)$$

Accordingly, if $\eta=1$, the current gain in the SI buffer structure by the injection of holes with respect to the stored electrons is as follows:

$$G_{SI} \sim \frac{P_A \, v_P}{n_B \, v_n} \exp \frac{q}{kT} (V_{GA} - V_G{}^*{}_A) \quad (3)$$

As compared with the conventional buffer structure wherein $V_{GA}=G_{G^*A}$, the above-mentioned value is given by $$G_C \sim \frac{P_A \, v_P}{n_B \, v_n} \quad (4)$$

This is only an injection ratio that is dependent substantially on diffusion. Since $$\exp \frac{q}{kT} (V_{GA} - V_G{}^*{}_A) > 1 \quad (5)$$

$G_{SI} > G_c$. With the SI buffer structure, the number of holes that are injected is far larger than in the conventional buffer structure, and hence the ON-state voltage decreases accordingly.

It is evident that the SI buffer structure provides a hole injection efficiency higher than the conventional buffer structure of the same size $L_B$. Moreover, in the SI buffer structure the resistance is substantially dependent on the resistivity in the n+-type layers 11, since the layers 11 are formed in a meshed, striped or similar pattern as referred to previously. Hence the lateral resistance of the SI buffer layer is very small. The electrons in the respective n−-type layer 12 easily reach the neighboring n+-type layers 11 through drift motion, because the resistance in the layers 11 is low. In the conventional buffer structure the n-type buffer layer has a base structure of a predetermined resistivity and there is no region corresponding to a channel; therefore, electrons flow, by diffusion, in the n-type buffer layer in accordance with its predetermined resistivity. Thus the resistance of the entire buffer layer of the SI buffer structure is far lower than the resistance in the conventional structure.

When the lifetime of electrons is long, they stay long in the n-type buffer layer, in particular, in the n+-type layers 11. If they remain too long, an excessive injection of holes occurs correspondingly, causing a delay in the carrier storage time and in the tail time when the device is turned OFF. It is necessary, therefore, to make provision for bringing out the electrons stored in the n+-type layer 11 while at the same time securing the number of holes injected to some extent. To meet this requirement, in the SI buffer structure the SI buffer layer 2 is electrically shorted to the anode region 2 at a fixed pitch, which is selected to be shorter than 2Ln, taking into account the diffusion length Ln of electron which depends on its lifetime, as referred to previously. With such a construction, it is possible to absorb the stored electrons to the anode electron 1 with a proper time constant while securing the desired number of holes which are injected from the anode region 2.

As a shorted anode structure utilizing the static induction effect, there has been proposed an SI shorted anode structure such as disclosed in Japanese Pat. Appln. No.250254/87 (Pat. Pub. Disc. Gazette No.93169/89). The present invention utilizes the static induction effect in the n-type buffer structure. Since the present invention is provided with the buffer layer utilizing the static induction effect, the structure between the gate and anode has a combination of a p+ in+ p+ structure and a p+ in− p+ structure. In the case where the n−-type layer 12 is sufficiently depleted by the n+-type layer 11, the depletion layer which spreads from the gate region is blocked by the SI buffer layer composed of the n+-type and n−-type layers 11 and 12—this ensures sufficiently blocking a high-intensity electric field. It is preferable, of course, to minimize the afore-mentioned sizes $B_{n+}$ and $L_B$. The n+-type layer 11 can be replaced with a metal layer as described later on. In such an instance, a Schottky junction is employed, but it may also be combined with a pn junction, taking a high breakdown voltage into consideration.

While in the above the buffer layer has been described to be shorted to the anode region 2 at the pitch smaller than 2Ln, the buffer short-circuit layers 4 could be omitted by effecting lifetime control of electrons. That is, the lifetime of electrons present in the neighborhood of the n+-type and n−-type layers 11 and 12 is set to a predetermined value by controlling their lifetime, and when the lifetime of electrons is short, the effect of the short-circuit layers 4 is lessened. In this instance, the buffer short-circuit layers 4 need not positively formed but instead means for lifetime control needs to be provided. For example, proton, electron beam or similar radiant rays irradiation, or diffusion of heavy metal takes place.

The SI buffer structure, the principle, construction and operation of which have been described above, is applicable to a variety of semiconductor devices, such as an SI thyristor, a GTO, a buried gate GTO, an SCR, an ASCR, an IBGT, a MOS-controlled thyristor and a MOS-controlled SI thyristor. With the SI buffer structure, it is possible to achieve a high carrier injection efficiency, a high breakdown voltage, or high-speed turn-ON, or high-speed turn-OFF by virtue of a low resistivity, which are impossible with conventional buffer structures.

(Embodiment 1)

Figure 3:
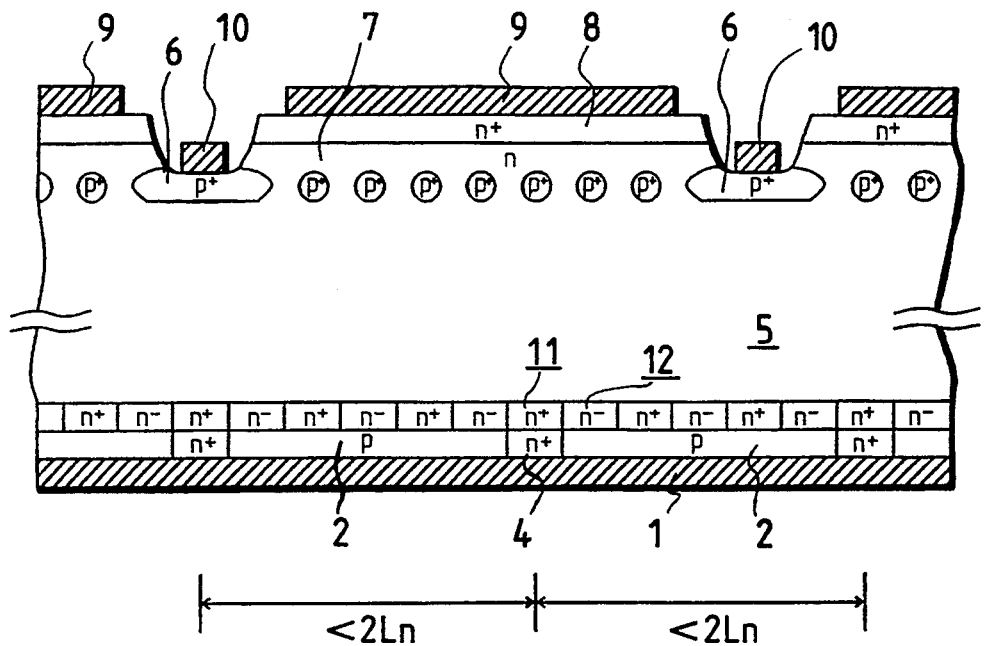
FIG. 3 is a sectional view schematically illustrating a first embodiment of the present invention in which the SI buffer structure is applied to a buried gate SI thyristor.

FIG. 3 is a sectional view schematically illustrating the internal construction of an embodiment of the present invention in which the SI buffer structure is applied to a buried gate SI thyristor. The buffer short-circuit layers 4 are provided at a pitch smaller than 2Ln, and the SI buffer layer is composed of the n+-type and n−-type buffer layers 11 and 12. It is also possible to adopt a construction in which the n-type layers 11 and 12 are provided at a pitch corresponding to that of the gate regions 6 so that the n+-type layer 11 lies just under a gate channel. In FIGS. 3 through 26 the parts corresponding to those in FIGS. 1 and 2 are identified by the same reference numerals.

(Embodiment 2)

Figure 4:
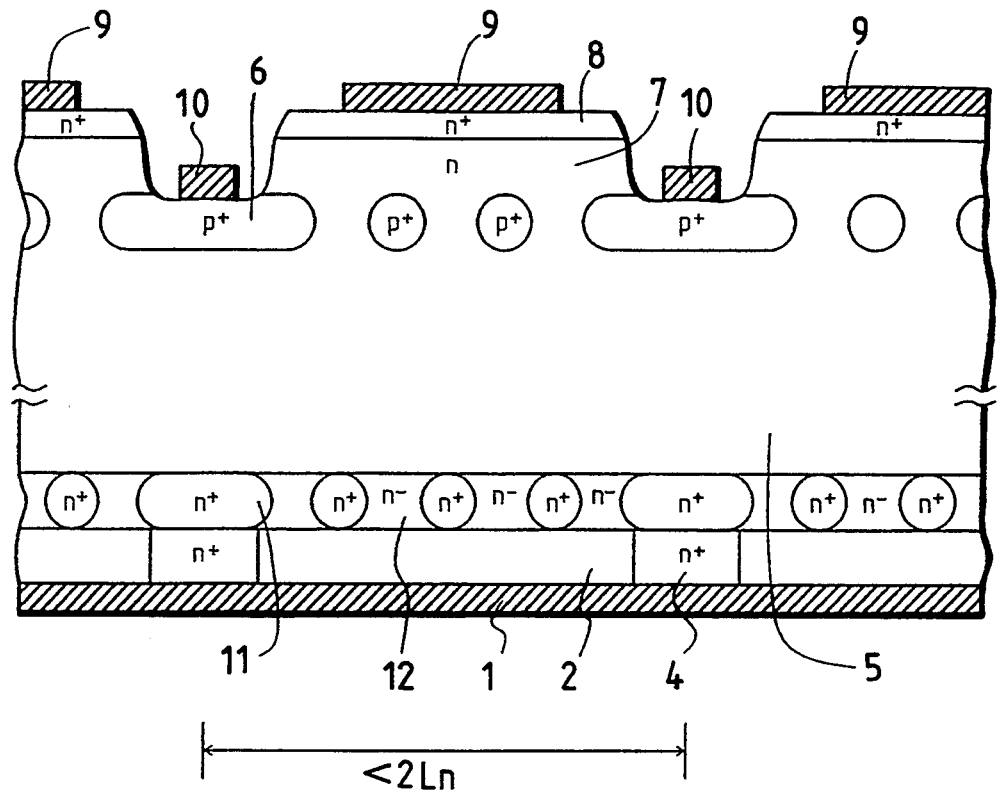
FIG. 4 is a sectional view schematically illustrating a second embodiment of the present invention in which the SI buffer structure is applied to a fine buried gate SI thyristor.

FIG. 4 is a sectional view schematically illustrating another embodiment of the present invention in which the gate electrodes 10 are disposed at shorter intervals than in the FIG. 3 embodiment and the buffer short-circuit layers 4 underlie the gate electrodes 10. In this embodiment, the number of channels per unit segment is smaller than in the FIG. 3 embodiment but the device is miniaturized accordingly. The buffer short-circuit layers 4 are provided at the afore-mentioned pitch smaller than 2Ln.

Figure 5:
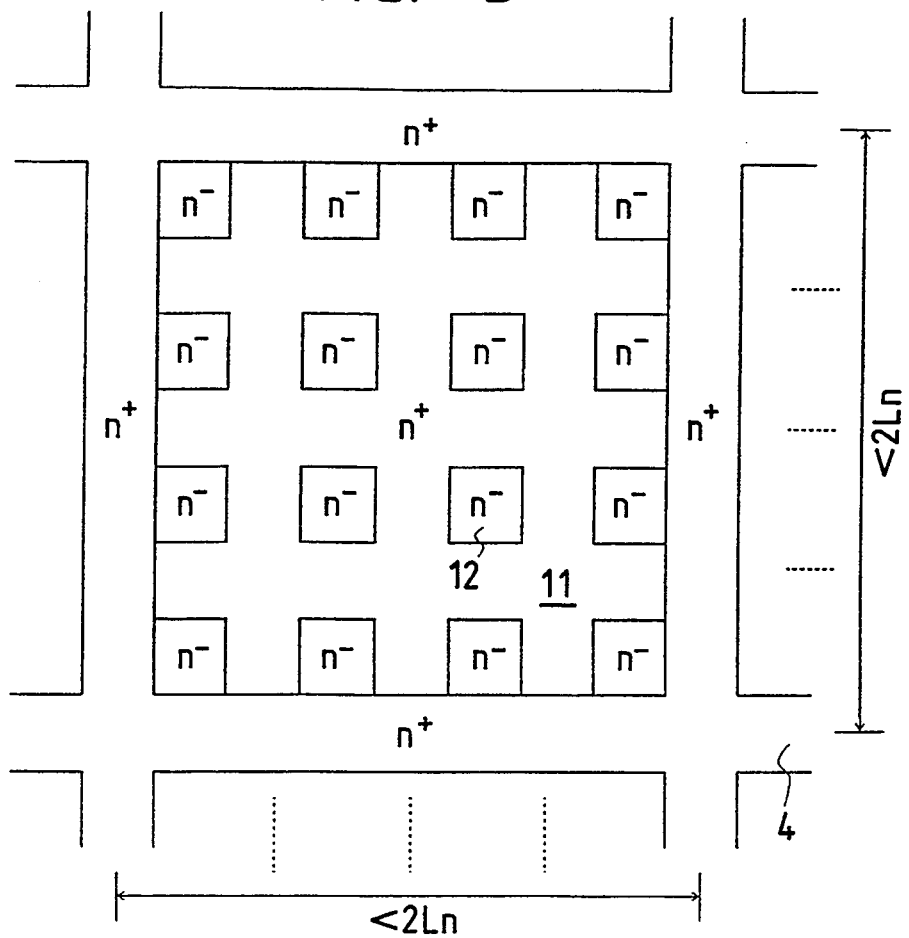
FIG. 5 is a schematic diagram showing, by way of example, patterns of the SI buffer structure and n-type buffer short-circuit layers.

FIG. 5 is a plan view schematically illustrating, by way of example, patterns of the buffer short-circuit layers 4 and the SI buffer layer composed of the n+- type and n⁻-type layers 11 and 12. The n⁺-type layers 11 are shorted to the anode electrode 1 via the buffer short-circuit layer 4. The width and impurity density of each n⁺-type layer 12 are chosen such that it is sufficiently depleted by the diffusion potential between it and the n⁺-type layer 12.

Figure 6:
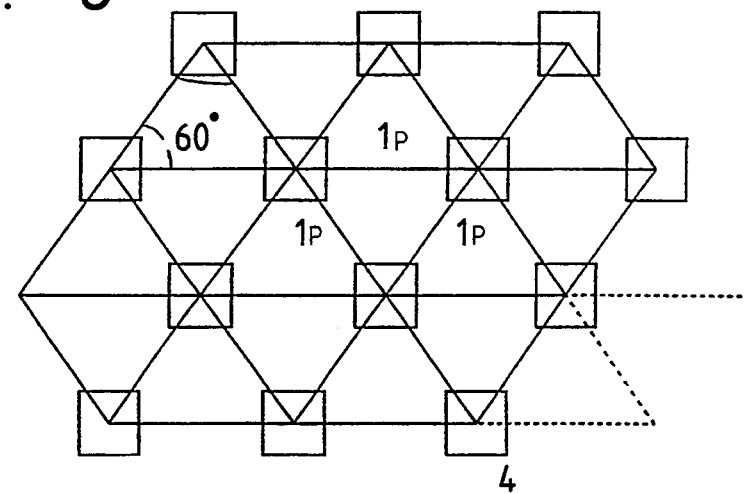
FIG. 6 is a schematic diagram showing another example of the pattern of arrangement of the n-type buffer short-circuit layers.

While in FIG. 5 the buffer short-circuit layers 4 are shown to be arranged in a mesh-like form, FIG. 6 shows another example in which the layers 4 are arranged at a pitch indicated by $1_P$. The buffer short-circuit layers 4 are each provided at the vertex of a regular hexagon or triangle. The pitch $1_P$ is smaller than 2Ln as referred to previously.

(Embodiment 3)

Figure 7:
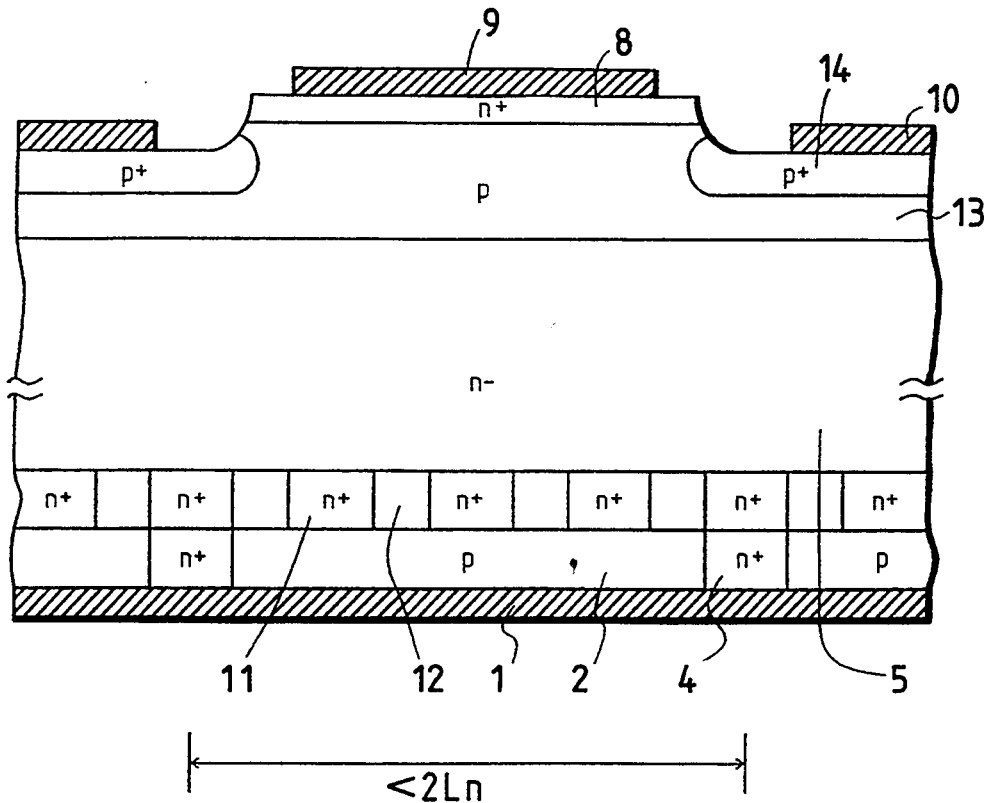
FIG. 7 is a sectional view schematically illustrating a third embodiment of the present invention in which the SI buffer structure is applied to a gate turn-off thyristor.

FIG. 7 is a sectional view schematically illustrating the internal construction of another embodiment of the present invention in which the SI buffer structure is applied to a GTO (a gate turn-OFF thyristor). Reference numeral 13 denotes a p-type base layer and 14 a high impurity concentration base layer. Also in this embodiment the buffer short-circuit layers 4 are arranged at the pitch smaller than 2Ln.

(Embodiment 4)

Figure 8:
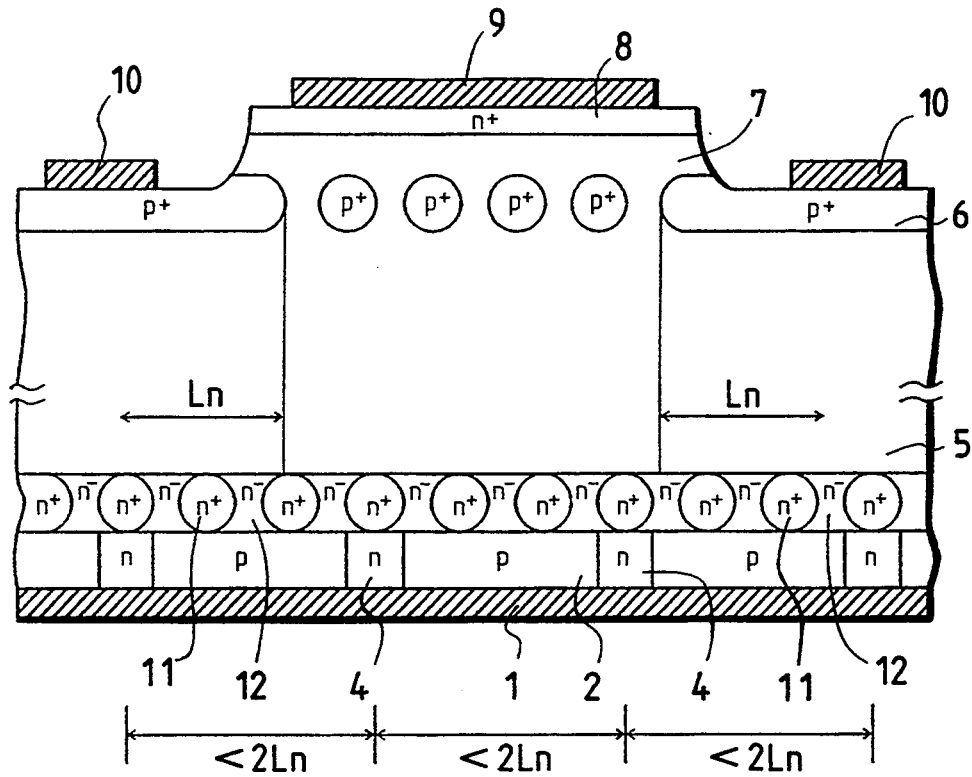
FIG. 8 is a sectional view schematically illustrating a fourth embodiment of the present invention in which the SI buffer structure is applied to a buried gate SI thyristor.

FIG. 8 is a sectional view schematically illustrating the internal construction of another embodiment of the present invention, which is a modified form of the buried gate SI thyristor employing the SI buffer structure. The structural feature of this embodiment resides in that the SI buffer structure is extended by the diffusion length Ln of electrons, taking into acount the spread of electrons injected from the cathode side.

Figure 9:
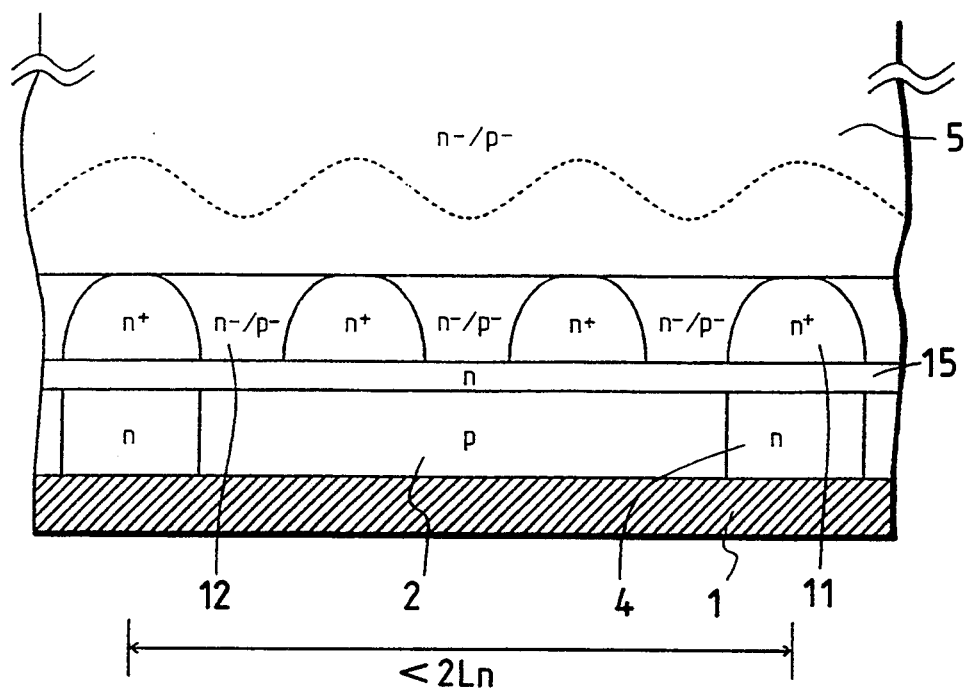
FIG. 9 is a schematic diagram showing another example of the construction of the SI buffer structure.

FIG. 9 schematically shows another example of the SI buffer structure, in which an n-type thin layer 15 is interposed between the anode region 2 and the buffer layer composed of the n⁺-type and n⁻-type layers 11 and 12. The thin layer 15 is provided to control, by its impurity density (concentration) and thickness, the injection of holes from the anode region 2. The buffer layer comprised of the n⁺-type and n⁻-type layers 11 and 12 mainly blocks the depletion layer spreading from the gate side, and hence hinders a high-intensity electric field, and by setting the impurity density (concentration) and thickness of the thin layer 15 to predetermined values, the number of holes which are injected from the anode region 2. The size corresponding to the layer thickness $L_B$ in FIG. 1 corresponds to the thickness of the thin layer 15 in FIG. 9.

The structure depicted in FIG. 9 can be obtained by forming the n⁺-type layers 11 through diffusion, which is followed by epitaxial growth of the n-type thin layer 15 and then by epitaxial growth of the p-type anode region 2. The n⁺-type layers 11 may be formed relatively thick so as to block a high breakdown voltage. It is desirable that the injection of holes from the anode region 2 be controlled by the thickness of the thin interposed layer 15 and that the holes injected into the n⁻/p⁻ layers 12 be allowed to perform drift motion. Also in this embodiment the buffer short-circuit layers 4 are provided at the pitch smaller than 2Ln.

(Embodiment 5)

Figure 10:
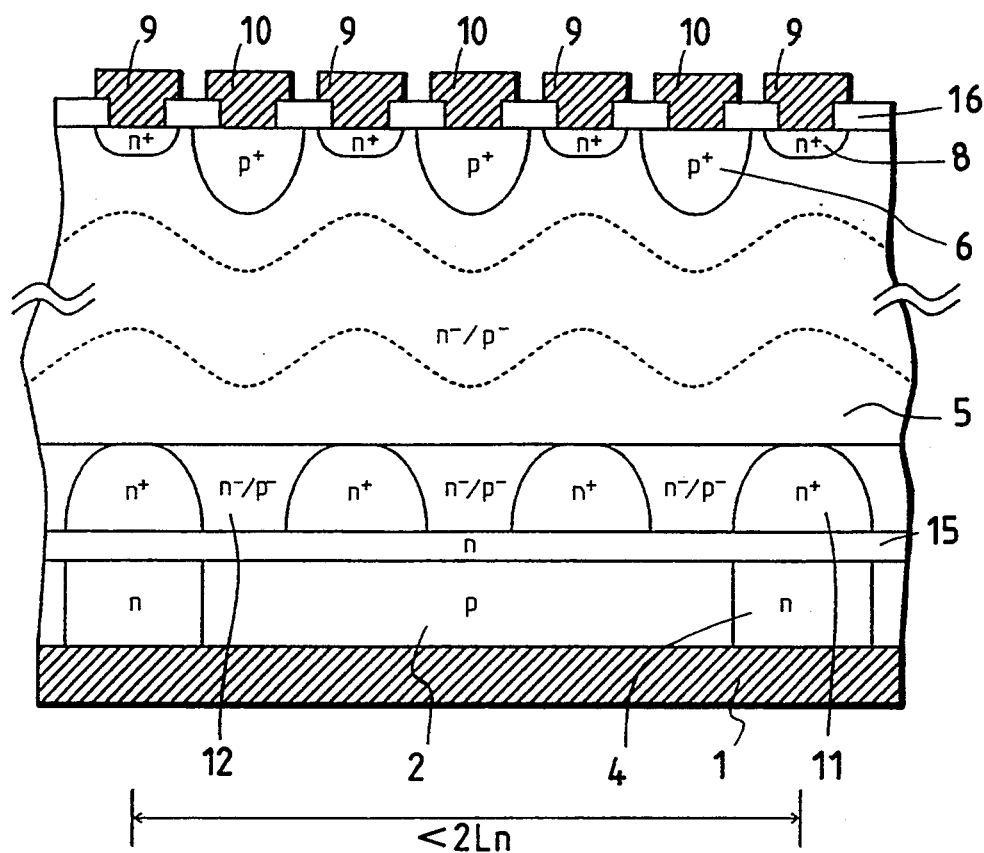
FIG. 10 is a sectional view schematically illustrating a fifth embodiment of the present invention in which the SI buffer structure is applied to a planar gate SI thyristor.

FIG. 10 schematically illustrates, in section, the internal construction of a planar gate SI thyristor employing the SI buffer structure shown in FIG. 9. Reference numeral 16 denotes an insulating layer. The parts corresponding to those in the above are identified by the same reference numerals.

(Embodiments 6 and 7)

Figure 11:
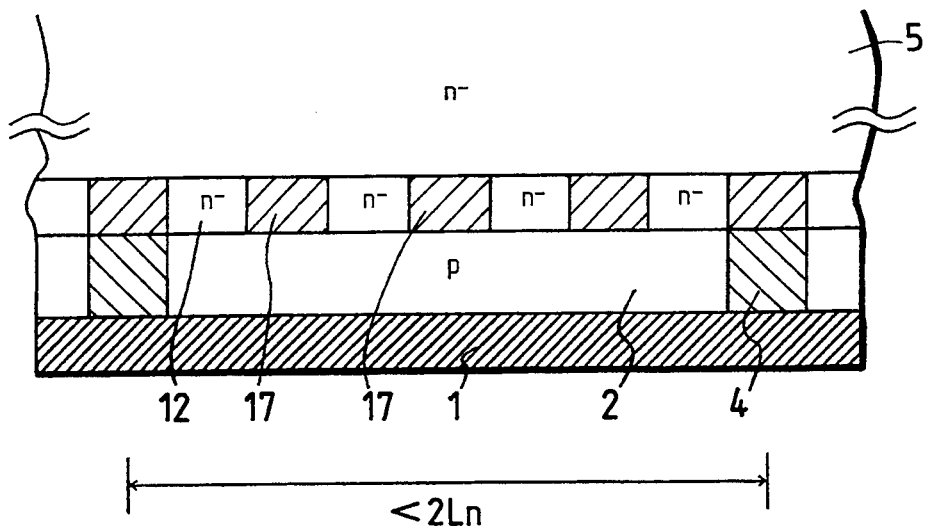
FIG. 11 is a schematic diagram illustrating the SI buffer structure employing metal layers 17 in accordance with a sixth embodiment of the present invention.
Figure 12:
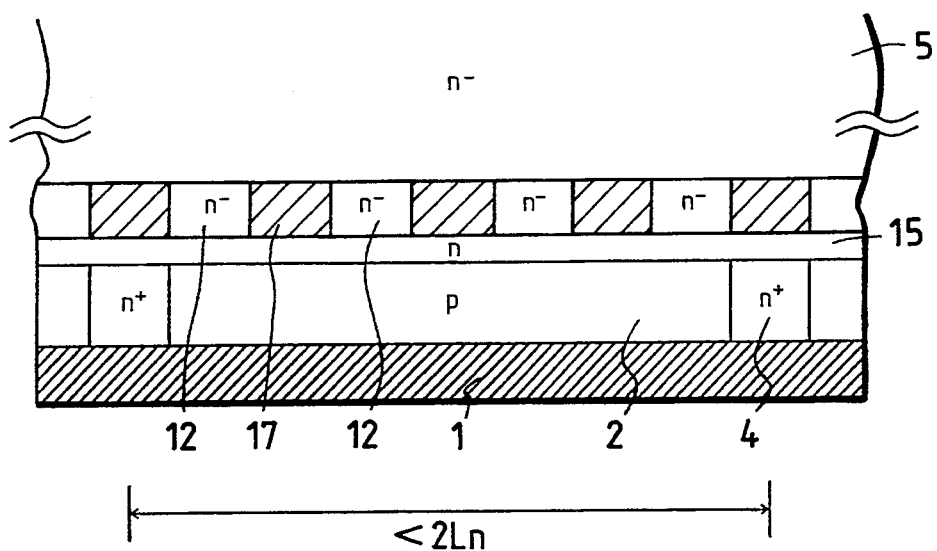
FIG. 12 is a schematic diagram illustrating a modified form of the SI buffer of FIG. 11 which employs a thin layer 15 interposed between a buffer layer and an anode region in accordance with a seventh embodiment of the present invention.

FIGS. 11 and 10 schematically illustrate modified forms of the SI buffer structure in which metal layers 17 are used in place of the n⁺-type layers 11. The metal layers 17 may be formed of tungsten (W), molybdenum (Mo), copper (Co), platinum (Pt) or similar metal, or their silicides. In FIG. 11 the buffer short-circuit layers 4 are also formed of one of such metals and provided at the pitch smaller than 2Ln. In FIG. 12 the anode region 2 and the SI buffer layer (17, 12) are separated by the thin layer 15 interposed therebetween. Of course, the buffer short-circuit layers 4 are provided at the pitch smaller than 2Ln.

The SI buffer structure according to the present invention is not limited specifically to those described above but it may have a construction in which n⁺-type layers are buried in n⁻-type layers or flat n⁺-type layers are formed in p⁻-type layers. It is also possible to dispose the buffer short-circuit layers 2 at a reduced pitch so that they each correspond to one of the n⁺-type buried layers.

Figure 13:
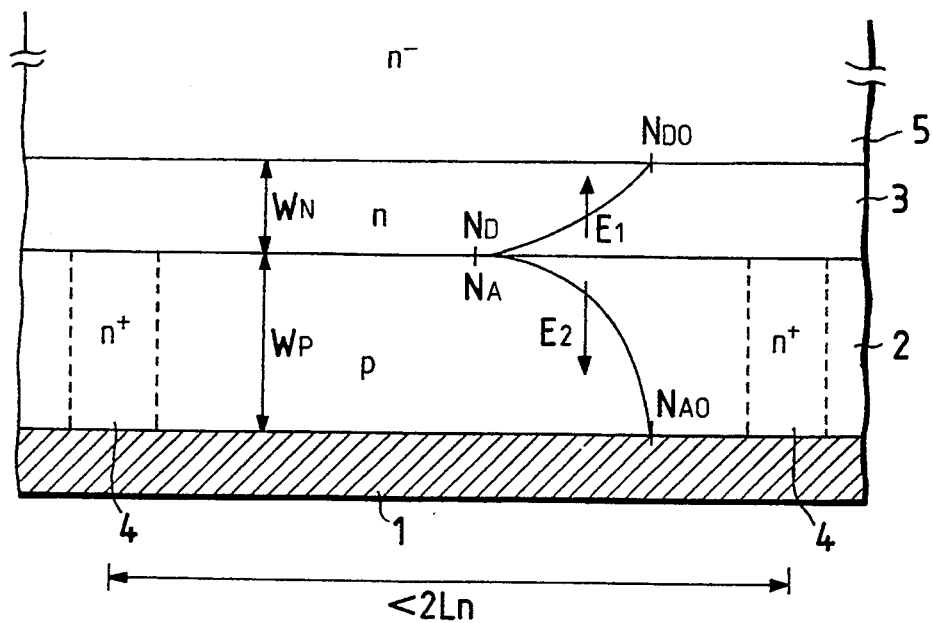
FIG. 13 is a sectional view schematically illustrating the internal construction of a portion near the anode of the semiconductor device with the drift buffer structure according to an eighth embodiment of the present invention.

The semiconductor device having the drift buffer structure according to the present invention is a bipolar device in which electrons and holes coexist as carriers, and it performs a switching operaion in the same manner as does a thyristor device or bipolar device of a non-latch up mode. In terms of its principle of operation, the semiconductor device of the drift buffer structure has a feature in the motion of holes and electrons in the vicinity of the anode. Since the motion of holes and electrons is this semiconductor device is the same as in an ordinary thyristor element, a GTO, a static induction thyristor, a MOS-controlled element, a MOS gate element, etc., the operation of this device will be described in connection with the anode side. FIG. 13 is a sectional view schematically illustrating the internal construction of the semiconductor device in the neighborhood of its anode. In FIG. 13, reference numeral 1 denotes an anode electrode, 2 an anode region, 3 an n-type buffer layer and 5 an n⁻-type high resistivity semiconductor layer. In the n-type buffer layer 3 and the p-type anode region 2 there are set such impurity density (concentration) gradients as shown. The impurity density (concentration) gradients are set so that the n-type impurity density $N_D$ of the buffer layer side and the p-type impurity density $N_A$ of the anode region side in the vicinity of the np junction formed betwen the buffer layer 3 and the anode region 2 gradually decrease down to $N_{D0}$ and $N_{A0}$ toward the nn⁻ junction between the buffer layer 3 and the high resistivity layer 5 and the anode region 2, respectively. The feature of the drift buffer structure in operation appears during the turn-ON operation, the ON state and the turn-OFF operation of the device.

During the turn-ON operation for transition from the OFF state to the ON state, holes injected from the p-type anode region 2 are accelerated by a drift field $E_1$ caused by the impurity density (concentration) gradient in the n-type buffer layer 3, and hence are easily injected into the n⁻-type high resistivity layer 5. In this instance, since the impurity density (concentration) is high in the vicinity of the pn junction between the anode region 2 and the buffer layer 3, holes which are injected from the anode electrode 1 into the anode region 2 are also accelerated by a drift field $E_2$, and hence are easily driven to the pn junction between the anode region 2 and the buffer layer 3. Thus, the drift buffer structure depicted in FIG. 13 has a construction in which the injection of holes is facilitated by the internal fields $E_2$ and $E_1$ in the anode region 2 and the n-type buffer layer 3.

Similarly, electrons injected from the cathode side into the n⁻-type high resistivity layer 5 are likely to be stored in the high impurity density (concentration) region in the n-type buffer layer 3, that is, in the vicinity of the np junction formed between the layer 3 and the anode region 2. In the buffer layer 3 the electrons injected thereinto from the n⁻-type high resistivity layer 5 are also accelerated by the above-mentioned drift field $E_1$. When the electrons once stored in the buffer layer 3 are injected therefrom into the anode region 2, they are also accelerated by the above-mentioned drift field $E_2$ and are allowed to reach the anode electrode i with ease.

During the ON-state period of the device, the injection of holes from the anode electrode 1 into the high resistivity layer 5 side is continued by the drift fields $E_2$ and $E_1$, and the electrons injected from the cathode side are allowed to flow into the anode electrode 1 by the drift fields $E_1$ and $E_2$.

During the turn-OFF operation for transition from the ON state to the OFF state, it is necessary that the electrons stored in the n-type buffer layer 3, in particular, be extinguished quickly. As a consequence of the extinction of excessively stored electrons, a potential barrier against holes, Vbi(n+ p+), develops in the buffer layer 3 as viewed from the anode region 2, and similarly, a potential barrier against electrons, Vbi(n+ p+), which is of the same height as that of the above-mentioned potential barrier, is developed in the anode region 2 as viewed from the buffer layer 3. In the drift buffer structure, electrons are likely to be stored in the neighborhood of the high impurity density (concentration) region near the np junction between the buffer layer 3 and the anode region 2 owing to the drift field $E_1$, and in the anode region 2 the electrons are readily driven by the drift field to the anode electrode 1. Thus, the discharge efficiency of electrons from the buffer layer 3 to the anode electrode 1 is high and the potential barrier Vbi(n+ p+) is easily established in the interface of the n-type buffer layer 3 and the p-type anode region 2. In other words, the turn-OFF performance of the device is excellent.

The above is the operation characteristic of the semiconductor device having the drift buffer structure according to the present invention. The drift buffer structure can also be combined with other structures to perform the same operation as described above. For instance, an SI buffer structure or a structure equivalent to a buried gate may be provided in the buffer layer 3. In this case, operations of the SI buffer and the drift buffer are combined, and the resistivity is lowered in the n-type buffer layer, providing form improved switching performance. The turn-OFF performance is also improved by the combined use of the drift buffer structure and a shorted anode or anode structure. It is also possible to combine the drift buffer structure with lifetime control.

The internal or drift fields $E_1$ and $E_2$ based on the impurity density (concentration) gradients can be implemented by a proper combination of diffusion, ion implantation, epitaxial growth, lamination and similar techniques.

(Embodiment 8)

FIG. 13 schematically shows, in section, the construction near the anode of the semiconductor device having the drift buffer structure in accordance with an eighth embodiment of the present invention. The cathode side structure may be any of an ordinary SCR, a GTO, an SI thyristor, an IGBT, a MOS gate thyristor, a MOS-controlled thyristor and similar structures.

The structural feature of this embodiment resides in that impurity density (concentration) fradients are set in the buffer layer 3 and the anode region 2 to generate drift fields for both holes and electrons, as described above. It is a matter of course that such an impurity dnesity (concentration) gradient can be provided in only one of the buffer layer and the anode region 2. For convenience of description, the structure of FIG. 13 is shown to develop the drift field in either of them.

Figure 14:
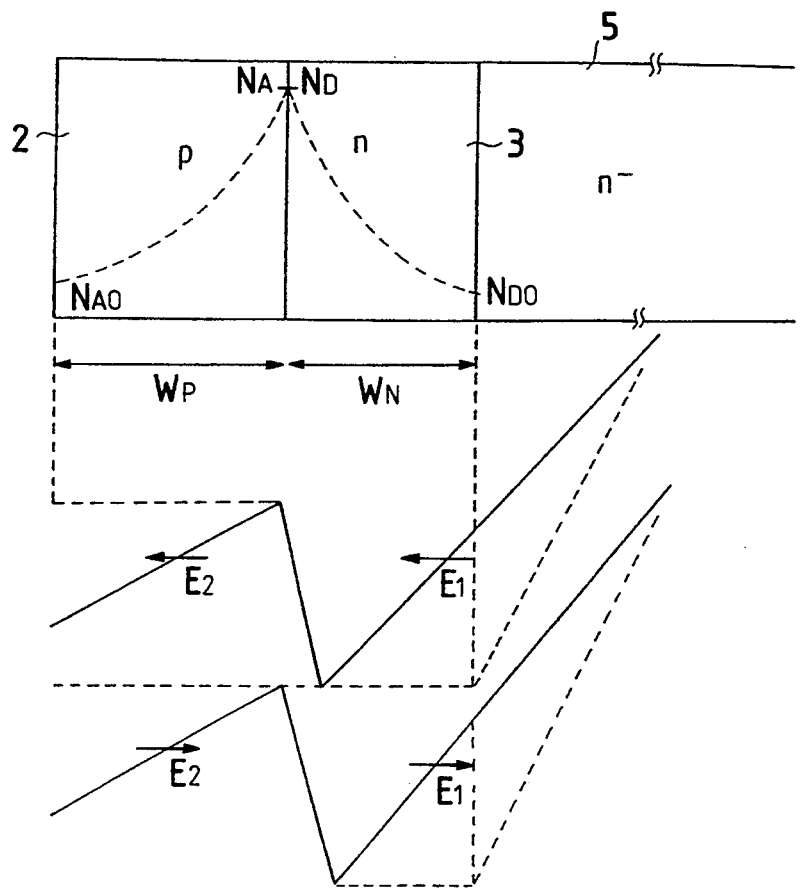
FIG. 14 is a schematic diagram showing the potential distribution of a pn junction near the anode of the semiconductor device (of the eighth embodiment) when it is in the OFF state.

FIG. 14 schematically shows the potnetial districution in the neighborhood of the pn junction formed between the anode region 2 and the buffer layer 3 when the semiconductor device is in the OFF state. From FIG. 14 it can be seen how the drift fields $E_2$ and $E_1$ in the anode region 2 and the buffer layer 3 are formed by the impurity density (concentration) gradients set therein. The arrows "←" above the reference characters $E_2$ and $E_1$ indicate acceleration fields for electrons and the arrows "→" above $E_2$ and $E_1$ acceleration fields for holes.

Letting the impurity density (concentration) of the buffer layer 3 near the np junction between it and the anode region 2 and the impurity density (concentration) of the buffer layer 3 near the nn⁻ junction between it and the high resistivity layer 5 be represented by $N_D$ and $N_{D0}$, respectively, and assuming that the impurity density distribution is an exponential function distribution, the electric field $E_1$ in the buffer layer 3 is expressed as follows:

$$E_1 = \frac{V_N}{W_N} = \frac{kT}{qW_N} \ln \frac{N_D}{N_{D0}}, \quad (6)$$

where $V_N$ is a voltage which is generated across the buffer layer widthwise thereof, $W_N$ is the thickness of the buffer layer 3, k is the Boltzmann's constant and T is absolute temperature.

Similarly, letting the impurity density (concentration) of the anode region 2 in the vicinity of the np junction between the buffer layer 3 and the region 2 and the impurity density (concentration) of the anode region 2 near the anode electrode 1 be represented by $N_A$ and $N_{A0}$, respectively, and assuming that the impurity density (concentration) distribution is an exponential function distribution, the electric field $E_2$ in the anode region 2 is expressed as follows:

$$E_2 = \frac{V_P}{W_P} = \frac{kT}{qW_P} \ln \frac{N_A}{N_{A0}} \quad (7)$$

where $V_P$ is a voltage which are generated across the anode region 2 widthwise thereof and $W_P$ is its thickness.

The drift fields $E_1$ and $E_2$ accelerate the motion of holes and electrons during the turn-ON operation and the ON state of the semiconductor device and prompts the discharge of electrons to the anode electrode 1 during the turn-OFF operation.

Hence it is possible to decrease the ON-state voltage and reduce the turn-OFF time as well as the turn-ON time.

The structure shown in FIG. 13 can be obtained by an ordinary diffusion method, an ion implantation method and a multi-stage epitaxial growth method. The impurity density (concentration) gradient in the buffer layer can be formed by use of diffusion, ion implantation or epitaxial growth techniques. The impurity density (concentration) gradient in the anode region 2 is reverse to the impurity density (concentration) distribution in an ordinary anode region, and hence can be implemented by a combination of a p+-type high impurity concentration epitaxial growth and p- and p⁻-type medium and low impurity concentration epitaxial growths. When the anode region 2 is thin, the impurity density (concentration) gradient can be also provided by multi-stage ion implantation with varying acceleration voltages and doses.

The simplest way of obtaining a structure equivalent to that of FIG. 13 is to form the buffer layer 3 as an n-n+-n-n⁻ or n+-n⁻ structure and the anode region 2 as a p+-p, p+-p⁻, or p+-p-p⁻ structure to ultimately provide desired impurity density (concentration) distributions.

As indicated by the broken lines in FIG. 13, the short-circuit layers 4 may also be provided to facilitate the discharge of electrons to the anode electrode 1 during the turn-OFF operation. It is preferable that the short-circuit layers 4 be arranged at the afore-mentioned pitch smaller than 2Ln, taking into account the diffusion length Ln of electrons which depends on their lifetime. While in Embodiment 8 the drift fields $E_1$ and $E_2$ have been described in connection with the case where the impurity density (concentration) distribution is an exponential function distribution, they are not limited specifically thereto, of course.

The structure of FIG. 13 can also be combined with a static induction (SI) buffer structure, a buried gate structure, an SI shorted structure and a shorted MOS gate structure. Of course, lifetime control can be effected in the structure of FIG. 13 and in the cases where it is combined with the above-mentioned other structures.

(Embodiment 9)

Figure 15:
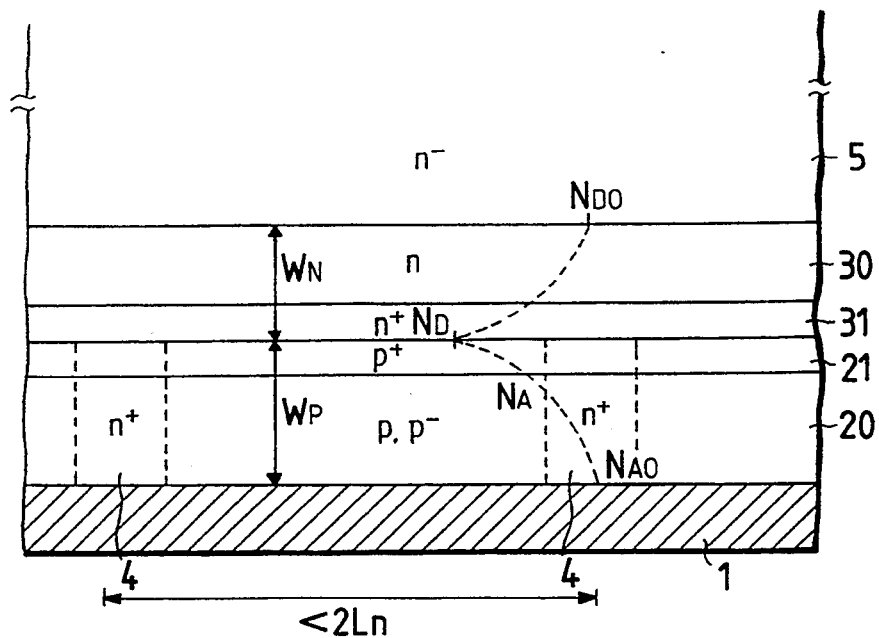
FIG. 15 is a sectional view schematically illustrating the internal construction of the portion near the anode of the semiconductor device with the drift buffer structure according to a ninth embodiment of the present invention.

FIG. 15 is a sectional view of another embodiment of the present invention, schematically illustrating the internal construction near the anode of a semiconductor device employing the drift buffer structure. As the cathode side structure, a thyristor, an IGBT, a GTO, an SI thyristor and similar structures can be used as is the case with the FIG. 13 embodiment. The parts corresponding to those in FIG. 13 are identified by the same reference numerals.

In FIG. 15, reference numeral 1 denotes an anode electrode and 4 short-circuit layers which are provided as required. The structural feature of this embodiment resides in that the n-type buffer layer is formed by n+-type and n-type layers 31 and 30 and that the p-type anode region is composed of p+-type and p-(p⁻-)type layers 21 and 20. The n-type layer 30 may be formed to have an impurity density (concentration) gradient $N_D$-$N_{D0}$ indicated by the broken line or a uniform impurity concentration lower than that of the n+-type layer 31. Likewise, the p-(p⁻-) type layer 20 may be formed to have an impurity density (concentration) gradient $N_A$-$N_{A0}$ indicated by the broken line or a uniform impurity concentration lower that of the n+-type layer 21. With such a construction, it is possible to generate equivalent drift fields $E_1$ and $E_2$ in the buffer layer and the anode region, respectively. Hence, a drift buffer structure equivalent to that shown in FIG. 13 can be implemented.

(Embodiment 10)

Figure 16:
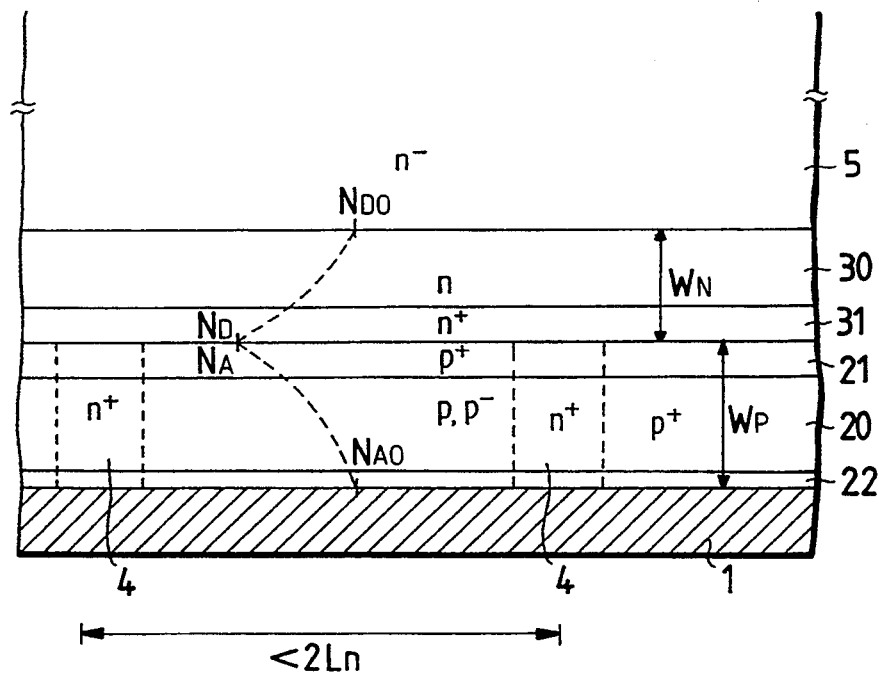
FIG. 16 is a sectional view schematically illustrating the internal construction of the portion near the anode of the semiconductor device with the drift buffer structure according to a tenth embodiment of the present invention.

FIG. 16 is a sectional view of another embodiment of the present invention, schematically illustrating the anode side construction of a semiconductor-device employing the drift buffer structure. The parts corresponding to those in FIGS. 13 and 14 are identified by the same reference numerals and no description will be given of them. The structural feature of this embodiment resides in that the anode region is formed by a p+-type layer 21, a p-(p⁻-) type layer 20 and a p+-type layer 22. The layer 22 is an anode contact layer. The layer 20 may be substantially depleted. Conversely speaking, its impurity density (concentration) and sizes are selected so that it may be essentially depleted. Alternatively, the overall thickness Wp of the anode region (21, 20, 22) is chosen small so that the voltage at the anode electrode 2 may immediately become equal to the potential of the p+-type layer 21. As indicated by the broken line, the impurity density (concentration) distribution $N_D$-$N_{D0}$ may be provided in the n-type layer 30, or it may also be formed to have a uniform impurity density (concentration) lower than that of the n-type layer 31. Likewise, the impurity density (concentration) distribution $N_A$-$N_{A0}$ may be provided in the layer 20, or it may also be formed to have a uniform impurity density (concentration) lower than that of the p+-type layer 21. The p+-type layer 22 is a thin layer which ensures good contact between the anode region and the anode electrode 1, allowing the potential at the anode electrode 1 to be immediately transmitted to the layer 21.

As is the case with the above, the short-circuit layers 4 may be provided as indicated by the broken lines but they need not always be provided, in which carrier lifetime control may also be employed. The short-circuit layers 4, if provided, may preferably be separated at the afore-mentioned pitch smaller than 2Ln.

(Embodiment 11)

Figure 17:
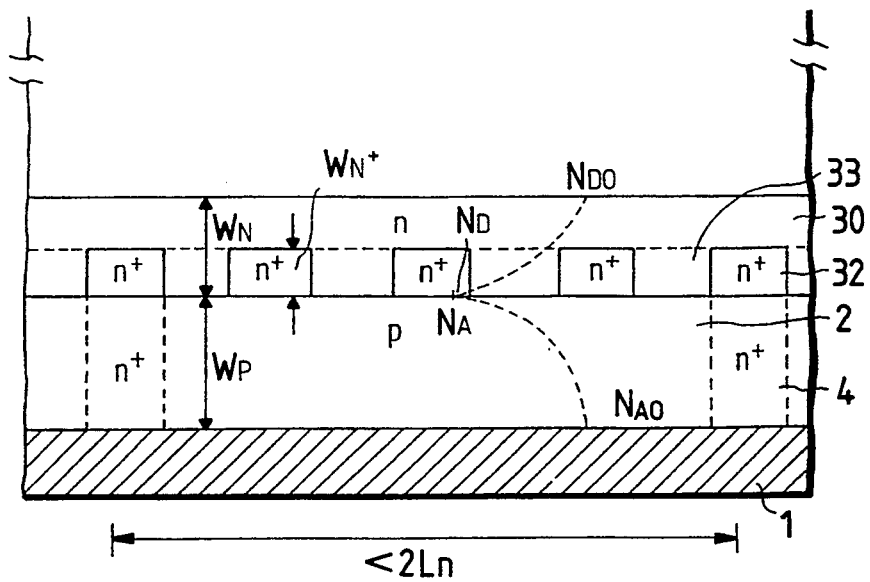
FIG. 17 is a sectional view schematically illustrating the internal construction of the portion near the anode of the semiconductor device with the drift buffer structure according to an eleventh embodiment of the present invention.

FIG. 17 is also a sectional view of another embodiment of the present invention, schematically illustrating the anode side construction of a semiconductor device utilizing the drift buffer structure. The structural feature of this embodiment lies in that the drift buffer structure includes an SI buffer structure or buried gate buffer structure. The buried gate buffer structure is one that has electrically common gate layers 32 buried in the n-type buffer layer 30 at regular intervals so as to reduce the resistivity distribution in the entire buffer layer. The SI buffer structure is a structure in which the buried layers 32 are provided at reduced intervals, low impurity density (concentration) buffer layers 33 are essentially depleted and their potential is variable with the potential of high impurity density (concentration) buffer layers 33 in a capacitive coupled manner. The former operates on the base resistance effect, whereas the latter operates on the JFET or SI effect.

In the structure shown in FIG. 17, the buffer layer 30 has an impurity density (concentration) gradient $N_D$-$N_{D0}$ and the anode region 2 an impurity density (concentration) gradient $N_A$-$N_{A0}$. The high impurity density (concentration) buffer layers 32 can be considered to form a buffer layer of a predetermined thickness, together with the low impurity density (concentration) buffer layers 33. That is, in Embodiments 9 and 10 depicted in FIGS. 15 and 16, respectively, the low impurity density (concentration) buffer layers 33 of a predetermined size are disposed in the n+-type layer 31 at predetermined intervals to form an equivalent channel region for holes. According to this embodiment, the turn-ON characteristic can be further improved by the combined use of the drift buffer structure and the SI buffer or buried gate buffer structure.

Figure 18:
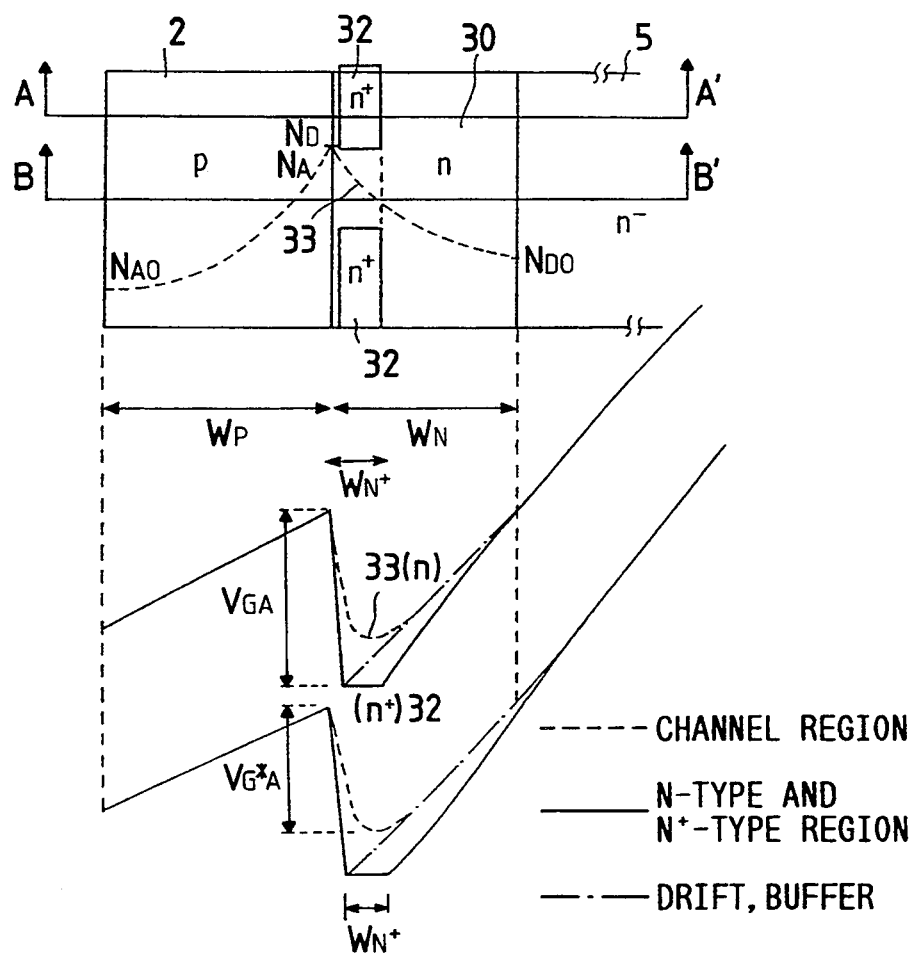
FIG. 18 is a schematic diagram showing the potential distribution of the pn junction near the anode in the semiconductor device of the eleventh embodiment when it is in the OFF state.

FIG. 18 schematically shows the potential distribution in the neighborhood of the pn junction at the anode side when the semiconductor device of this embodiment is in the OFF state. The solid line indicates the potential distribution in the plane along the line A—A'. That is, since the potential distribution passes through the n+-type buffer layer 32, the potential is lowered by the thickness of the layer 32. The broken line indicates the potential in the plane along the line B—B'. That is, the potential distribution passes through the equivalent channel region formed by the low impurity density (concentration) buffer layer 33. The one-dot chain line indicates the potential distribution in the case where the n+-type layer 32 is not provided and the n-type buffer layer 30 has the impurity density (concentration) gradient $N_D$-$N_{D0}$. The potential distribution indicated by the broken line (corresponding to the line B—B') corresponds to the potential distribution of the structure in which the SI buffer structure and the drift buffer structure are combined.

The low impurity density (concentration) buffer layer 33 is subjected to potential barrier control by the static induction effect, and hence is essentially depleted. It is also possible that only the layer 33 has an impurity density (concentration) lower than that of the buffer layer 30 regardless of the impurity density (concentration) distribution $N_D$-$N_{D0}$ for the drift buffer.

The operation of the SI buffer structure is such as described above, and also in this embodiment the following expression holds. That is, when the potential in the n-type buffer layer 33 varies with a potential change by electrons stored in the n+-type buffer layer 32, the current gain by the injection of holes from the anode with respect to the stored electrons can equivalently be expressed as follows:

$$G \propto \frac{N_A v_P}{n_B v_n} \exp \frac{q}{kT} (V_{GA} - V_G{*}_A), \quad (8)$$

Where $N_A$ is the impurity density (concentration) in the neighborhood of the pn junction in the anode region, $n_B$ is the impurity density (concentration) in the n+-type buffer layer 33, $V_P$ is the hole injection rate, $V_n$ is the rate at which the stored electrons are injected into the anode region from the n+-type buffer layer 32, q is a unit quantity of charges, k is the Boltzmann's constant, T is the absolute temperature, $V_{GA}$ is the diffusion potential of the pn+ junction formed between the anode region 2 and the buffer layer 32, and $V_{G*A}$ is the potential barrier height at the center of the channel 33 as viewed from the holes in the anode region 2.

The most important structural feature of this embodiment shown in FIG. 17 is the provision of the low impurity density (concentration) buffer layer 33 which forms the channel region for holes. This permits decreasing the ON-state voltage and reduction of the turn-ON time tgt and increasing di/dt during the turn-ON operation.

Also in this embodiment, the short-circuit layers may be provided at the pitch smaller than 2Ln, or lifetime control may be used.

Moreover, an equivalent channel region for electrons can also be provided in the anode region 2 as described later on.

(Embodiment 12)

Figure 19:
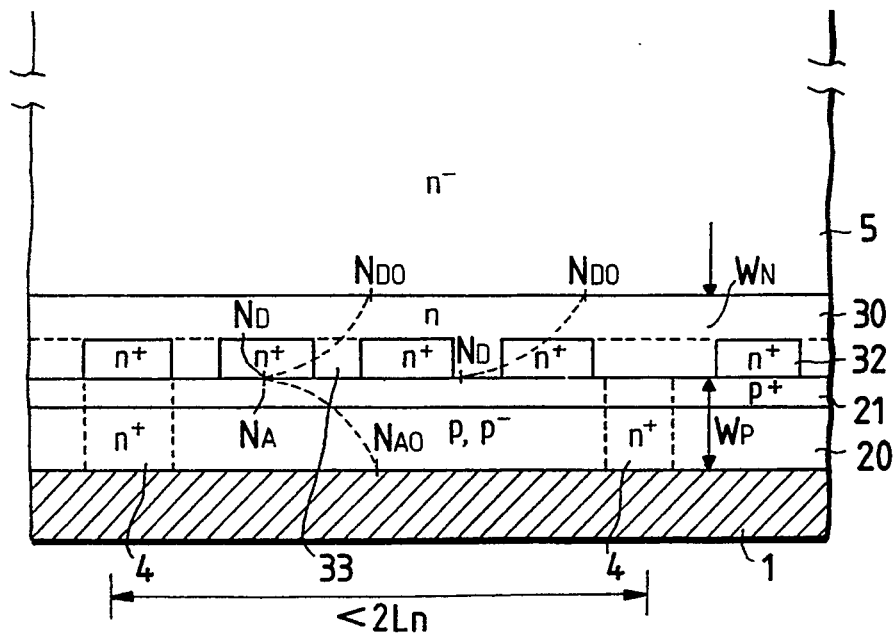
FIG. 19 is a sectional view schematically illustrating the internal construction of the portion near the anode of the semiconductor device with the drift buffer structure according to a twelfth embodiment of the present invention.

FIG. 19 is a sectional view of another embodiment of the present invention, schematically illustrating the anode side construction of a semiconductor device employing the drift buffer structure. The structural feature of this embodiment resides in that an impurity density (concentration) gradient is provided across a two-layered anode region composed of p+-and p(p−)-type layers 20 and 21 in the drift buffer structure combined with the SI buffer or buried gate buffer structure, such as shown in FIG. 17. This structure can be considered to be a combination of the structures of Embodiments 9 and 11. The anode region composed of the p+-type and p(p−)-type layers 21 and 20 can be formed by two-stage epitaxial growth, for example. It is evident that the n+-type anode short-circuit regions 4 can be provided for the n-type buffer layer 30.

Since the p+-type anode layer 21 is provided, the substantial thickness of the anode region can be regarded about the same as the thickness of the layer 21. Since the p(p−)-type anode layer 20 is essentially depleted while in operation, the potential of the anode electrode 1 is likely to immediately become equal to the potential of the p+-type anode layer 21. Letting the impurity density (concentration) of the p+-type anode layer 21 be represented by $N_A$, the current gain by the injection of holes from the anode can be given by the afore-mentioned expression (3).

(Embodiment 13)

Figure 20:
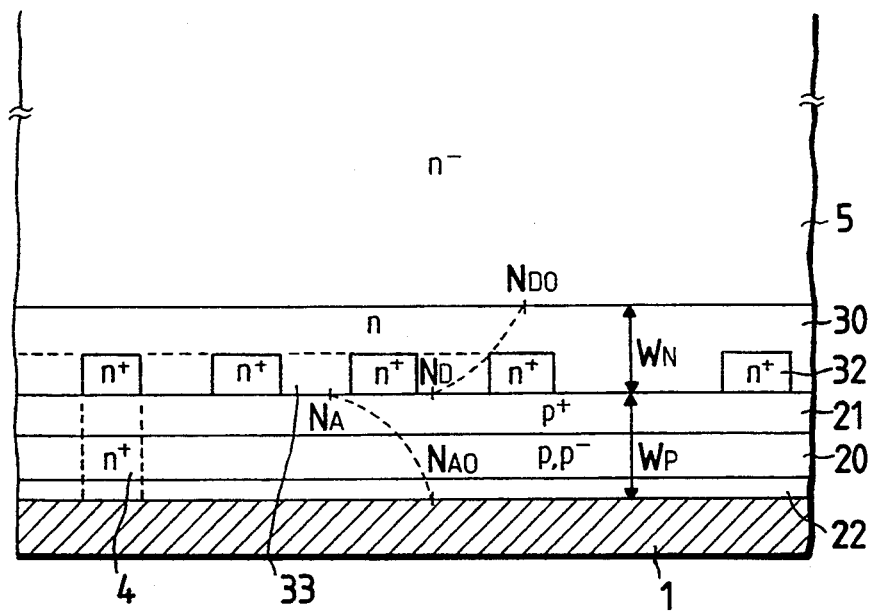
FIG. 20 is a sectional view schematically illustrating the internal construction of the portion near the anode in the semiconductor device with the drift buffer structure according to a thirteenth embodiment of the present invention.

FIG. 20 is a sectional view of another embodiment of the present invention, schematically illustrating the anode side construction of a semiconductor device employing the drift buffer structure. This embodiment has a drift buffer structure (32, 33, 30) provided with the SI buffer or buried gate buffer structure and an anode region (21, 20, 22). The structure of this embodiment is a modified form of the FIG. 19 structure, in which the p+-type anode contact layer 22 is provided to ensure good contact of the anode region with the anode electrode 1. Hence this embodiment can be regarded as a combination of Embodiments 10 (FIG. 16) and 11 (FIG. 17). The anode contact layer 22 ensures good contact of the anode electrode 1 with the anode layer 20, making it possible that the anode layer 21, the contact layer 22 and the anode electrode 1 immediately become equipotential as the depletion layer spreads in the anode layer 20.

(Embodiment 14)

Figure 21:
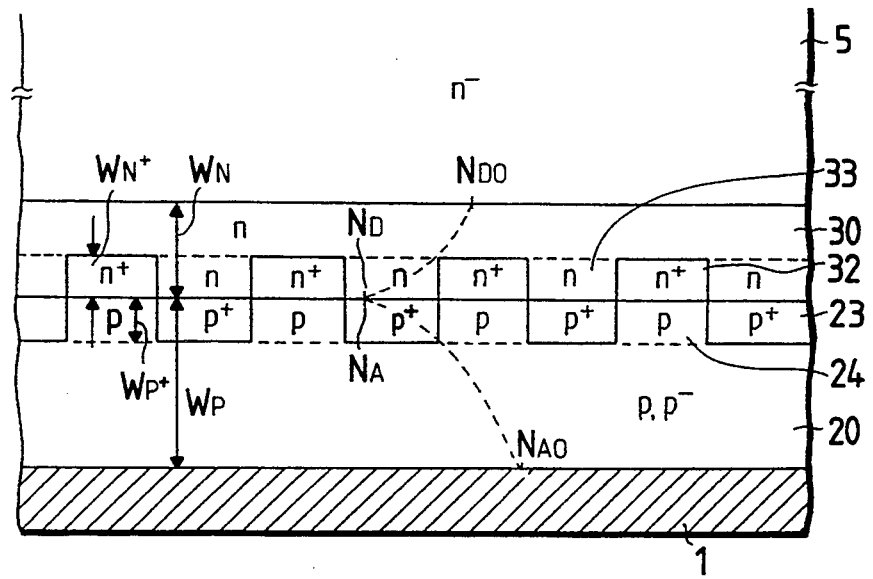
FIG. 21 is a sectional view schematically illustrating the internal construction of the portion near the anode in the semiconductor device with the drift buffer structure according to a fourteenth embodiment of the present invention.
Figure 22:
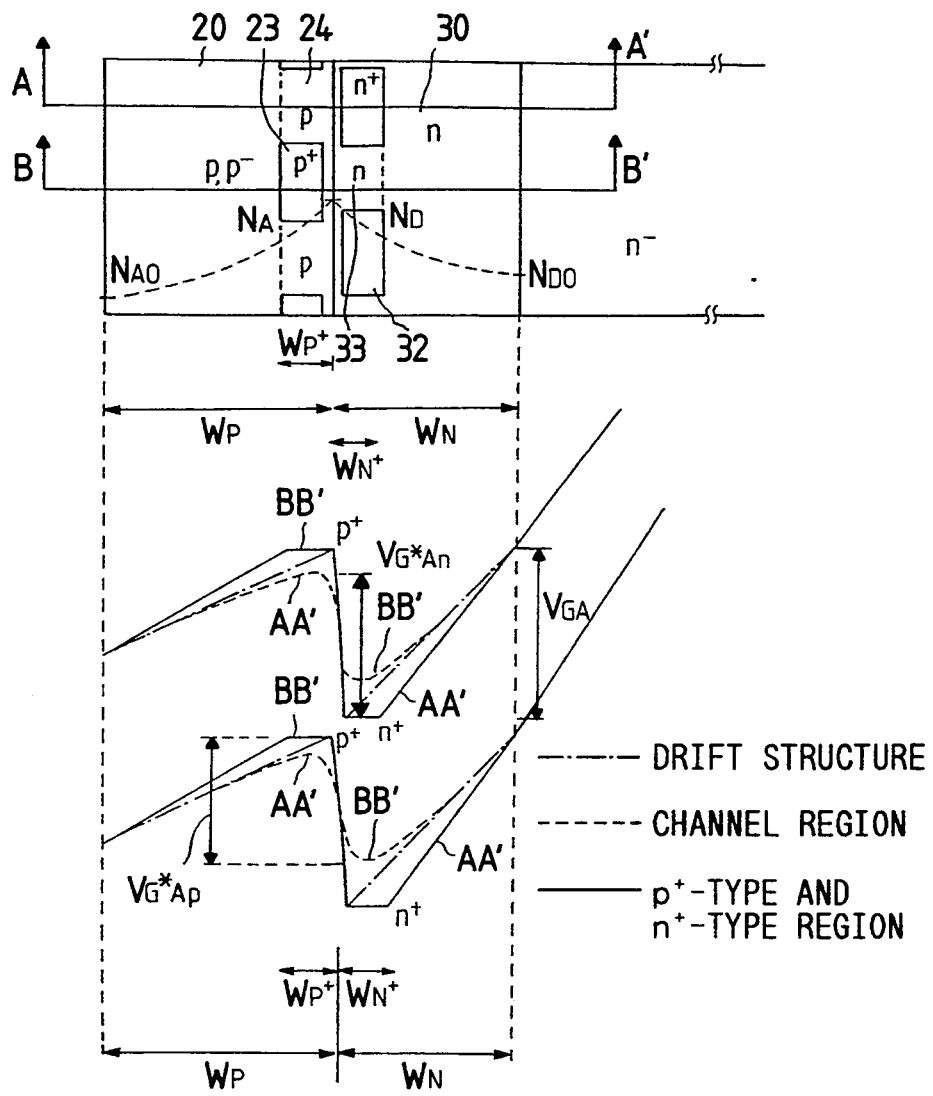
FIG. 22 is a schematic diagram showing the potential distribution of the pn junction near the anode in the semiconductor device of the fourteenth embodiment when it is in the OFF state.

FIG. 21 is a sectional view of another embodiment of the present invention, schematically illustrating the anode side construction of a semiconductor device employing the drift buffer structure. The structural feature of this embodiment lies in that a structure composed of a high impurity density (concentration) anode layer 23 and a low impurity density (concentration) anode layer 24 is built in the anode region. The (p, p−)-type anode layer 20 has an impurity density (concentration) gradient $N_A$-$N_{A0}$ so that the drift field $E_2$ can be generated. Similarly, an impurity density (concentration) gradient $N_D$-$N_{D0}$ is provided in the n-type buffer layer 30 as well so that the drift field $E_1$ can be generated. In this embodiment, since the anode region has a p+(23)p(24)p+(23)p(24) . . . structure formed in the vicinity of the interface between the anode region and the buffer layer (30, 32, 33), the low impurity density (concentration) anode layer 24 forms an equivalent channel region for electrons. It can be considered that there is provided in the anode region a structure similar to that in which the low impurity density (concentration) buffer layer 33 forms and equivalent channel region for holes. FIG. 22 schematically shows the potential distribution in the neighborhood of the anode when the semiconductor device is in the OFF state. In FIG. 22 reference character $W_{N+}$ denotes the thickness of the n+-type buffer layer and $W_{P+}$ the thickness of the p+-type anode layer. The line A—A' indicates the cutting plane passing through the low impurity density (concentration) anode layer 24 and the high impurity density (concentration) buffer layer 32 and the line B—B' the cutting plane passing through the high impurity density (concentration) anode layer 23 and the low impurity density (concentration) buffer layer 33. The broken line indicates the potential distribution in an equivalent channel region (24, 33) and the full line mainly indicates the potential distributions in the p(20)p+(23) junction and the n+(32)n(30) junction. The one-dot chain lines correspond to the potential distributions in the case where the p+-type layer 23 and the n+-type layer 32 are not provided and the buffer layer 30 and the anode region 20 have impurity density gradients which permit the generation of the drift fields. That is, the potential distributions are the same as shown in FIG. 14.

In the structure of this embodiment shown in FIG. 21, the potential barrier in the p-type region 24, which forms an equivalent channel region for electrons, is reduced by $V_{GA}-V_{G*An}$ as is evident from the potential distribution depicted in FIG. 22. Here, $V_{GA}$ is the diffusion potential in the p+(23)p(32) junction and $V_{G*An}$ is the potential barrier height in the p-type region 24 against electrons in the n+-type region 32. Likewise, the potential barrier in the n-type region 33, which forms an equivalent channel region for holes, is also reduced by $V_{GA}-V_{G*AP}$, where $V_{G*AP}$ is the potential barrier height in the n-type region 33 against holes in the p+-type region 23. The current gain by the injection of holes in such pn junctions as shown in FIGS. 21 and 22 is equivalently expressed as follows:

$$G \propto \frac{N_A^+}{N_D^-} \cdot \frac{v_p}{v_n} \exp\frac{q}{kT}(V_{GA} - V_G{*}_{Ap}) \quad (9)$$

and the current gain by the electron injection is equivalently given by $$G \propto \frac{N_D^+}{N_A^-} \cdot \frac{v_n}{v_p} \exp\frac{q}{kT}(V_{GA} - V_G{*}_{An}) \quad (10)$$

In the above, $N_D-$ and $N_D+$ are impurity densities of the n-typ egion 33 and the n+-type region 32, respectively, and $N_A-$ and $N_A+$ are impurity densities of the p-type region 24 and the p+-type region 23, respectively.

The exponential terms in the expressions (9) and (10) are far larger than 1, and hence the current gains are very large.

Also in the FIG. 21 embodiment the anode short-circuit layers may be provided, of course, and it is evident that this structure can be used in combination with carrier lifetime control.

(Embodiment 15)

Figure 23:
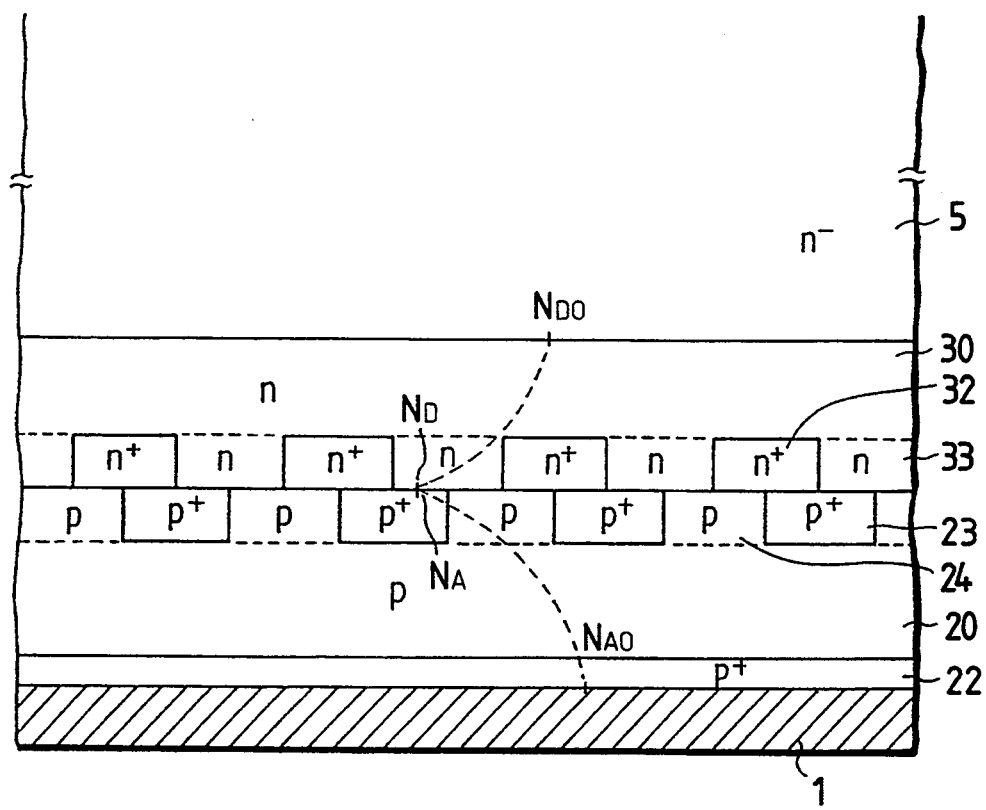
FIG. 23 is a sectional view schematically illustrating the internal construction of the portion near the anode in the semiconductor device with the drift buffer structure according to a fifteenth embodiment of the present invention.

FIG. 23 is a sectional view of another embodiment of the present invention, schematically illustrating the anode side construction of a semiconductor device employing the drift buffer structure. The structural feature of this embodiment resides in that the p+(23)p(24)p+p . . . structure is not completely matched with the n+(32)n(33)n+n . . . structure and that the p+-type anode contact layer 22 is provided. With the construction in which the above-mentioned two structures are not completely matched, it is also possible to obtain substantially the same performance as is obtainable with the construction shown in FIG. 21. It is desirable, however, that the n+(32)p(24) junction or p+(23) n(33) junction be formed in at least one portion of the pn junction.

(Embodiment 16)

Figure 24:
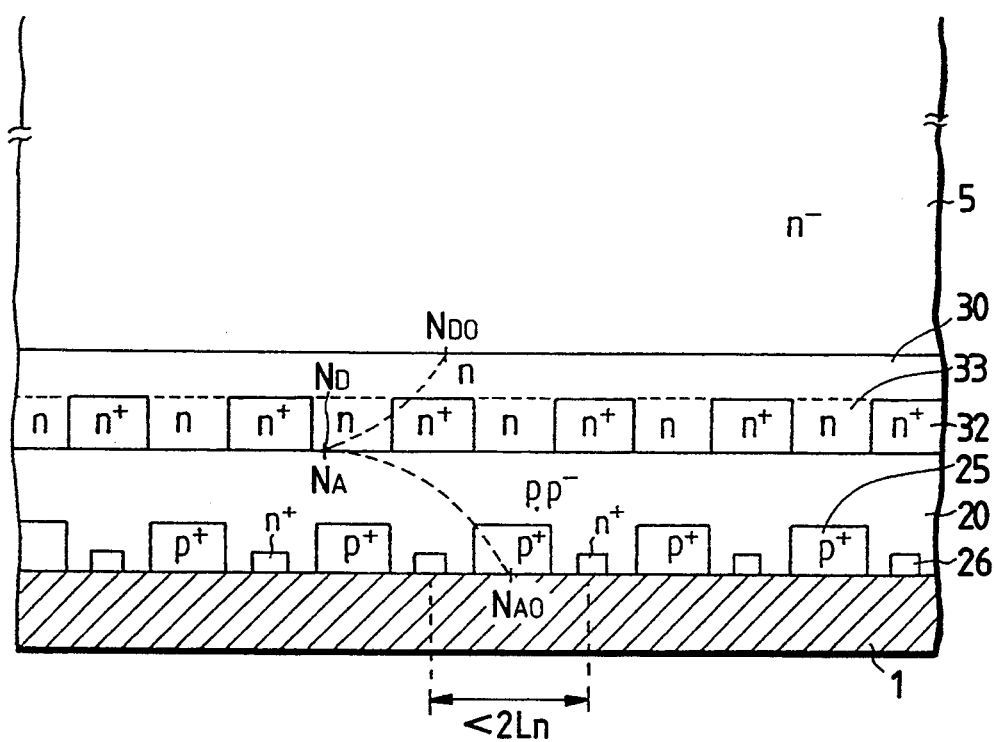
FIG. 24 is a sectional view schematically illustrating the internal construction of the portion near the anode in the semiconductor device with the drift buffer structure according to a sixteenth embodiment of the present invention.

FIG. 24 is a sectional view of another embodiment of the present invention, schematically illustrating the anode side construction of a semiconductor device employing the drift buffer structure. The structural feature of this embodiment is a combination of the drift buffer structure and a static induction shorted (SI shorted) structure. The SI shorted structure is disclosed by Nishizawa and Tamamushi in Japanese Pat. Pub. Disc. Gazette No.93169/89. In the structure of FIG. 24, the introduction of the SI shorted structure into the drift buffer structure serves as a substitute for the provision of the anode short-circuit layers 4 at the pitch smaller than 2Ln. Reference numeral 25 denotes p+-type SI anode regions and 26 n+-type SI short-circuit regions. The buffer layer 30 has the impurity density (concentration) gradient $N_D-N_{D0}$ and is provided with an SI buffer or buried gate buffer structure composed of the n+-type and n-type layers 32 and 33. The anode region 20 is essentially depleted but it may also have the impurity density (concentration) gradient $N_A-N_{A0}$. Moreover, structural various modifications of this embodiment can be effected and such an anode layer composed of the p+-type and p-type layers 23 and 24 as shown in FIGS. 19 and 20 may also be provided in the vicinity of the interface between the anode layer 21 and the buffer layer 30. In this embodiment, electrons that are injected from the n+-type layers 32 can efficiently be guided into n+-type SI short-circuit layers 26 when the device is turned OFF, and as an effect peculiar to the SI short-circuit, the injection of holes from the SI anode regions can be blocked with ease. On the other hand, when the device is turned ON, holes are injected from the p+-type anode regions 25 into the n-type layers 33 via the anode layer 20 being essentially depleted, thus forming equivalent channels for holes.

As is the case with ordinary SI short-circuit, it is preferable that the n+-type SI short-circuit regions 26 be formed at the pitch smaller than 2Ln.

(Embodiments 17, 18)

Figure 25:
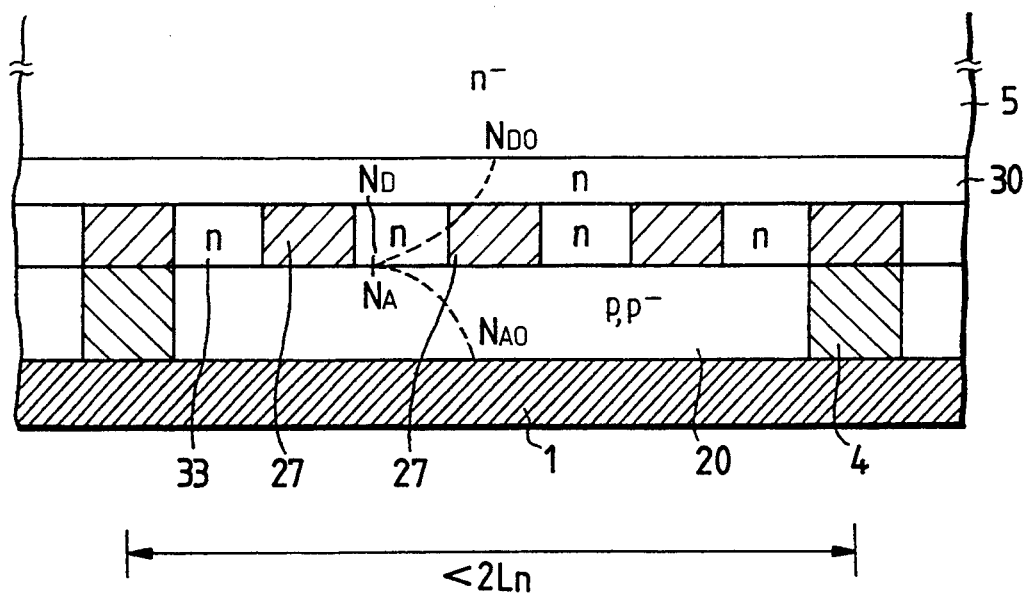
FIG. 25 is a sectional view schematically illustrating the internal construction of the portion near the anode in the semiconductor device with the drift buffer structure according to a seventeenth embodiment of the present invention.
Figure 26:
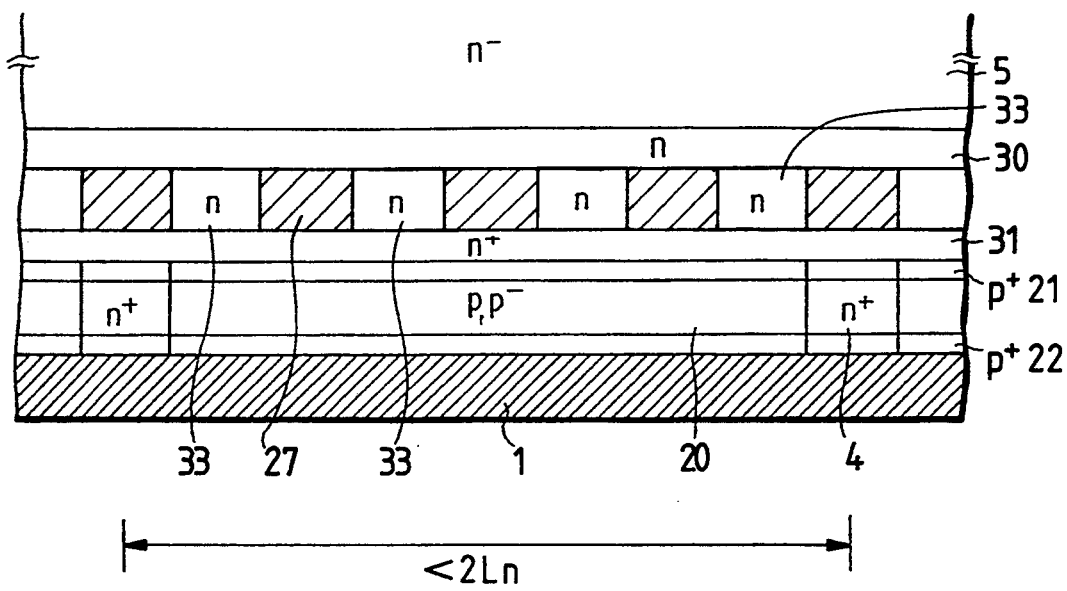
FIG. 26 is a sectional view schematically illustrating the internal construction of the portion near the anode in the semiconductor device with the drift buffer structure according to an eighteenth embodiment of the present invention.
Figure 27:
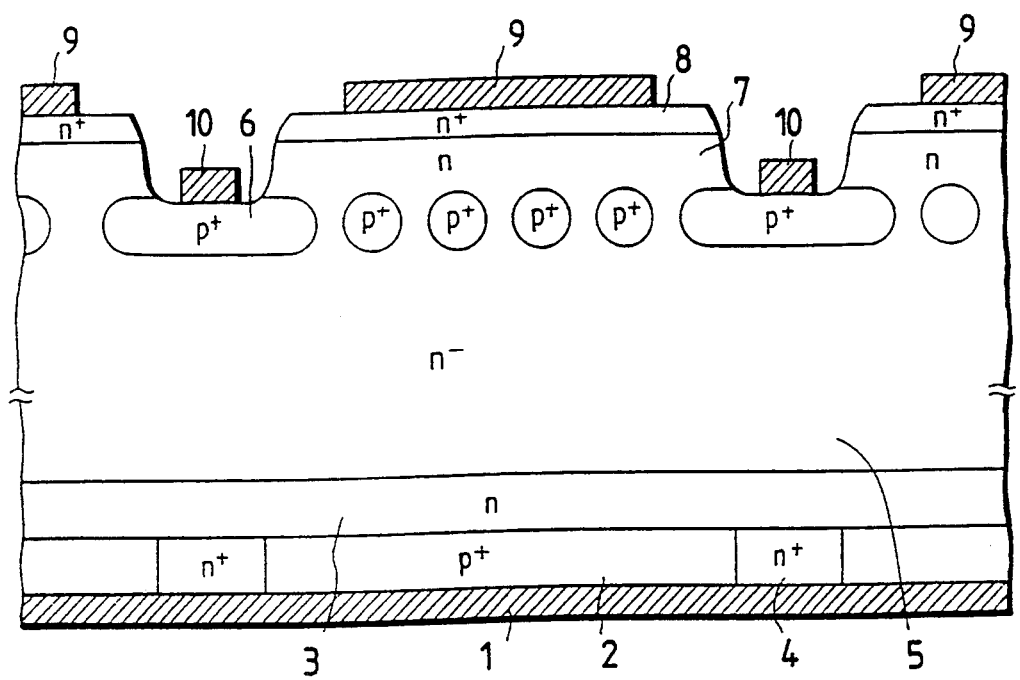
FIG. 27 is a sectional view showing an example of the construction of a conventional (prior art) buried gate SI thyristor with an n-type buffer layer.

FIGS. 25 and 26 are sectional views schematically illustrating modified forms of the FIG. 24 embodiment, in which the n+-type layers 32 are replaced with metal layers 27. The metal layers may be formed of tungsten (W), molybdenum (Mo), copper (Co), platinum (Pt) or similar metal, or their silicides. In the FIG. 25 embodiment the n-type buffer short-circuit layers 4 are also formed of such a metal and are provided at the pitch smaller than 2Ln. In FIG. 26 the anode region 20 and the SI buffer layer (27, 33) are separated by a thin layer 31 interposed therebetween and the anode region 20 has a p+(21)p(p−)(20)p+(22) structure.

The structural feature of these embodiment resides in that the metal layers 27 are formed in the buffer layer to reduce its overall resistivity distribution. In FIG. 25 the impurity density (concentration) gradient $N_A-N_{A0}$ is set in the anode region. In FIG. 26 the buffer layer is in contact with the anode region (21, 20, 22) through the thin n+-type layer 31. It is a matter of course that an impurity density (concentration) gradient may be set in the buffer layer 30 and/or the anode region (21, 20, 22) in the FIG. 26 embodiment as well.

Since the SI buffer structure according to the present invention permits reduction of the resistivity in the buffer layer in the lateral direction, electrons stored in the buffer layer are rapidly discharged to the anode electrode, and hence the turn-OFF performance of the device is improved.

With the provision of the SI buffer structure, holes are injected through the low impurity density (concentration) layer, and hence the quantity of holes injected increases and the turn-ON performance of the device improves—this permits high-speed turn-ON of the device and reduction of the ON-state voltage.

Since the high impurity density (concentration) and low impurity density (concentration) layers are connected by a depletion layer, a high-intensity electric field can be blocked.

The drift buffer structure, the principle, construction and operation of which have been described above, is applicable to a variety of semiconductor devices such as an SI thyristor, a GTO, a buried gate GTO, an SCR, an ASCR, an IGBT, a MOS-controlled thyristor and a MOS-controlled SI thyristor. With the drift buffer structure, it is possible in such devices to implement a high carrier injection, a high-speed turn-ON operation and a high turn-ON di/dt which are unobtainable with conventional buffer structures.

The combination of the drift buffer structure with the buried gate buffer or SI buffer structure allows ease in enhancing the breakdown voltage of the semiconductor device, and hence permits its high-speed operation. In particular, the high-speed turn OFF operation can be achieved by decreasing the resistivity of the buffer layer.

By combining the drift buffer structure with the SI buffer structure, the turn-ON characteristic of the semiconductor device can be improved and the ON-state voltage can be decreased by high efficiency carrier injection.

Moreover, when combined with the SI short-circuit structure, the drift buffer structure further improves the turn-OFF state of the semiconductor device.

Since the drift buffer structure is a structure in which forward fields are applied to both holes and electrons in the ON-OFF operation of the semiconductor device by the generation of drift fields in the anode region as well as in the buffer layer, carriers are speeded up. Hence, the drift buffer structure is effective in performing a high-speed, high-intensity-field, high-efficiency-carrier-injection and high-breakdown-voltage operation. As described above, the drift buffer structure can easily be combined with the SI buffer, buried gate buffer, SI short-circuit or shorted anode structure.

Since electric fields act to accelerate the motion of both of holes and electrons as described above, they both serve as carriers. The drift buffer structure is effective when applied to a bipolar device, that is, a device which operates in the latch-up mode.

It will be apparent that many modifications and variations may be effected without departing from the scope of the novel concepts of the present invention.

What is claimed is:

1. A semiconductor device which has an anode region, a cathode region, a gate region and a static induction buffer structure, wherein a buffer layer is provided adjacent to said anode region, said buffer layer includes high and low impurity regions, said low impurity regions are each essentially depleted by a diffusion potential between it and the corresponding one of said high impurity concentration regions, and said high impurity concentration regions are shorted to said anode region at a pitch smaller than 2Ln, where Ln is the diffusion length of electrons.

2. The semiconductor device of claim 1, wherein said buffer layer is reverse in conductivity type to said anode region.

3. The semiconductor device of claim 1, wherein said high impurity concentration regions of said buffer layer are reverse in conductivity type to said anode region and said low impurity concentration regions of said buffer layer are semiconductor regions which are identical in conductivity type with said anode region.

4. A semiconductor device which has an anode region, a cathode region, a gate region and a static induction structure, wherein a buffer layer is provided adjacent to said anode region, said buffer layer includes metal layer regions and low impurity concentration regions, said low impurity concentration regions are each essentially depleted by a diffusion potential between it and the corresponding one of said metal layer regions, and said metal layer regions of said buffer layer are shorted to said anode region at a pitch smaller than 2Ln, where Ln is the diffusion length of electrons.

5. The semiconductor device of any one of claims 1 to 4, wherein said buffer layer and said anode region are separated by a thin semiconductor layer interposed therebetween, said thin semiconductor layer being reverse in conductivity type to said anode region.

6. A semiconductor device which has an anode region, a cathode region, a gate region and a drift buffer structure, wherein a buffer layer is provided adjacent to said anode region and has an impurity concentration gradient that the impurity concentration therein gradually increases toward said anode region.

7. A semiconductor device which has an anode region, a cathode region, a gate region and a drift buffer structure, wherein a buffer layer is provided adjacent to said anode region, the impurity concentration in said anode region between an anode electrode provided in contact with said anode region and said buffer layer has a gradient that the impurity concentration gradually decreases as said anode electrode is approached from said buffer layer.

8. The semiconductor device of claim 6 or 7, wherein said buffer layer having said impurity concentration gradient includes high and low impurity concentration regions, and said low impurity concentration regions are each essentially depleted by a diffusion potential between said low impurity concentration region and the corresponding one of said high impurity concentration regions.

9. The semiconductor device of claim 8, wherein said high impurity concentration regions of said buffer layer are shorted to said anode region at a pitch smaller than 2Ln, where Ln is the diffusion length of electrons.

10. The semiconductor device of any one of claims 6 or 7, wherein said buffer layer is reverse in conductivity type to said anode region.

11. The semiconductor device of any one of claims 6 and 7, wherein said high impurity concentration regions of said buffer layer are reverse in conductivity type to said anode region, and said low impurity concentration regions of said buffer layer are semiconductor regions which are identical in conductivity type with said anode region.

12. The semiconductor device of claim 6 or 7, wherein said buffer layer having said impurity concentration gradient includes metal layer regions and low impurity concentration regions, and said low impurity concentration regions are each essentially depleted by a diffusion potential between said low impurity concentration region and the corresponding one of said metal layer regions.

13. The semiconductor device of claim 12, wherein said metal layer regions of said buffer layer are shorted to said anode region at a pitch smaller than 2Ln, where Ln is the diffusion length of electrons.

14. The semiconductor device of claim 8, wherein said buffer layer and said anode region are separated by a thin semiconductor layer interposed therebetween, said thin semiconductor layer being reverse in conductivity type to said anode region.

15. The semiconductor device of any one of claims 6 and 7, wherein said anode region includes high and low impurity concentration regions in the vicinity of said buffer layer, and said low impurity concentration regions of said anode region are each essentially depleted by a diffusion potential between it and the corresponding one of said high impurity concentration regions of said anode region.

16. The semiconductor device of claim 1, wherein said high impurity concentration regions of said buffer layer are reverse in conductivity type to said anode region and said low impurity concentration regions of said buffer layer are semiconductor regions which are intrinsic.

17. The semiconductor device according to claim 8, wherein said high impurity concentration regions of said buffer layer are reverse in conductivity type to said anode region, and said low impurity concentration regions of said buffer layer are semiconductor regions which are identical in conductivity type with said anode region.

18. The semiconductor device according to claim 9, wherein said high impurity concentration regions of said buffer layer are reverse in conductivity type to said anode region, and said low impurity concentration regions of said buffer layer are semiconductor regions which are identical in conductivity type with said anode region.

19. The semiconductor device according to claim 9, wherein said buffer layer and said anode region are separated by a thin semiconductor layer interposed therebetween, said thin semiconductor layer being reverse in conductivity type to said anode region.

20. The semiconductor device according to claim 10, wherein said buffer layer and said anode region are separated by a thin semiconductor layer interposed therebetween, said thin semiconductor layer being reverse in conductivity type to said anode region.

21. The semiconductor device according to claim 11, wherein said buffer layer and said anode region are separated by a thin semiconductor layer interposed therebetween, said thin semiconductor layer being reverse in conductivity type to said anode region.

22. The semiconductor device according to claim 12, wherein said buffer layer and said anode region are separated by a thin semiconductor layer interposed therebetween, said thin semiconductor layer being reverse in conductivity type to said anode region.

23. The semiconductor device according to claim 13, wherein said buffer layer and said anode region are separated by a thin semiconductor layer interposed therebetween, said thin semiconductor layer being reverse in conductivity type to said anode region.

24. The semiconductor device according to claim 8, wherein said anode region includes high and low impurity concentration regions in the vicinity of said buffer layer, and said low impurity concentration regions of said anode region are each essentially depleted by a diffusion potential between said low impurity concentration region and the corresponding one of said high impurity concentration regions of said anode region.

25. The semiconductor device according to claim 9, wherein said anode region includes high and low impurity concentration regions in the vicinity of said buffer layer, and said low impurity concentration regions of said anode region are each essentially depleted by a diffusion potential between said low impurity concentration region and the corresponding one of said high impurity concentration regions of said anode region.

26. The semiconductor device according to claim 10, wherein said anode region includes high and low impurity concentration regions in the vicinity of said buffer layer, and said low impurity concentration regions of said anode region are each essentially depleted by a diffusion potential between said low impurity concentration region and the corresponding one of said high impurity concentration regions of said anode region.

27. The semiconductor device according to claim 11, wherein said anode region includes high and low impurity concentration regions in the vicinity of said buffer layer, and said low impurity concentration regions of said anode region are each essentially depleted by a diffusion potential between said low impurity concentration region and the corresponding one of said high impurity concentration regions of said anode region.

28. The semiconductor device according to claim 12, wherein said anode region includes high and low impurity concentration regions in the vicinity of said buffer layer, and said low impurity concentration regions of said anode region are each essentially depleted by a diffusion potential between said low impurity concentration region and the corresponding one of said high impurity concentration regions of said anode region.

29. The semiconductor device according to claim 13, wherein said anode region includes high and low impurity concentration regions in the vicinity of said buffer layer, and said low impurity concentration regions of said anode region are each essentially depleted by a diffusion potential between said low impurity concentration region and the corresponding one of said high impurity concentration regions of said anode region.

30. The semiconductor device according to claim 14, wherein said anode region includes high and low impurity concentration regions in the vicinity of said buffer layer, and said low impurity concentration regions of said anode region are each essentially depleted by a diffusion potential between said low impurity concentration region and the corresponding one of said high impurity concentration regions of said anode region.

* * * * *